(12) United States Patent
Ito et al.

(10) Patent No.: US 7,015,166 B2
(45) Date of Patent: *Mar. 21, 2006

(54) CARBON-CONTAINING ALUMINUM NITRIDE SINTERED COMPACT AND CERAMIC SUBSTRATE FOR USE IN EQUIPMENT FOR MANUFACTURING OR INSPECTING SEMICONDUCTOR

(75) Inventors: Yasutaka Ito, Gifu (JP); Yasuji Hiramatsu, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/876,665

(22) Filed: Jun. 28, 2004

(65) Prior Publication Data

US 2004/0242400 A1 Dec. 2, 2004

Related U.S. Application Data

(63) Continuation of application No. 10/069,943, filed as application No. PCT/JP00/03041 on May 12, 2000, now Pat. No. 6,900,149.

(30) Foreign Application Priority Data

| Sep. 6, 1999 | (JP) | 11-251842 |
| Sep. 6, 1999 | (JP) | 11-251843 |
| Dec. 15, 1999 | (JP) | 11-355550 |
| Dec. 15, 1999 | (JP) | 11-355551 |
| Dec. 20, 1999 | (JP) | 11-360612 |
| Dec. 20, 1999 | (JP) | 11-360613 |

(51) Int. Cl.
C04B 35/581 (2006.01)

(52) U.S. Cl. ................................ 501/98.4; 501/98.5

(58) Field of Classification Search ............... 501/98.4, 501/98.5, 98.6
See application file for complete search history.

(56) References Cited

U.S. PATENT DOCUMENTS

| 4,478,785 | A | | 10/1984 | Huseby et al. |
| 4,803,183 | A | | 2/1989 | Schwetz et al. |
| 4,908,173 | A | | 3/1990 | Schwetz et al. |
| 5,529,962 | A | * | 6/1996 | Nakahata et al. ......... 501/98.4 |
| 5,728,635 | A | | 3/1998 | Kobayashi et al. |
| 5,908,799 | A | | 6/1999 | Kobayashi et al. |
| 5,998,321 | A | | 12/1999 | Katsuda et al. |
| 6,001,760 | A | | 12/1999 | Katsuda et al. |
| 6,156,686 | A | * | 12/2000 | Katsuda et al. ............ 501/96.1 |
| 6,271,163 | B1 | | 8/2001 | Yushio et al. |
| 6,383,962 | B1 | | 5/2002 | Obana et al. |
| 6,465,763 | B1 | | 10/2002 | Ito et al. |
| 6,475,606 | B1 | | 11/2002 | Niwa |
| 6,507,006 | B1 | | 1/2003 | Hiramatsu et al. |
| 6,677,557 | B1 | | 1/2004 | Ito et al. |
| 6,710,307 | B1 | | 3/2004 | Ito et al. |
| 6,717,116 | B1 | | 4/2004 | Ito et al. |
| 6,731,496 | B1 | | 5/2004 | Hiramatsu et al. |
| 6,753,601 | B1 | | 6/2004 | Hiramatsu et al. |
| 2003/0039796 | A1 | | 2/2003 | Ito et al. |
| 2003/0170415 | A1 | | 9/2003 | Hiramatsu et al. |

FOREIGN PATENT DOCUMENTS

| EP | 757023 | 2/1997 |
| JP | 60-71576 | 4/1985 |
| JP | 60-186479 | 9/1985 |
| JP | 62-223070 | 10/1987 |
| JP | 1-179765 | 7/1989 |
| JP | 2-6367 | 1/1990 |
| JP | 3-5375 | 1/1991 |
| JP | 5-101871 | 4/1993 |
| JP | 5-229871 | 9/1993 |
| JP | 6151332 | 5/1994 |
| JP | 9-45753 | 2/1997 |
| JP | 9-48668 | 2/1997 |
| JP | 9-48669 | 2/1997 |
| JP | 9-110405 | 4/1997 |
| JP | 9-315867 | 12/1997 |
| JP | 11-100270 | 4/1999 |
| JP | 11-312570 | 11/1999 |
| JP | 11-315570 | 11/1999 |
| JP | 2001-146476 | 5/2001 |

OTHER PUBLICATIONS

Report submitted for the opposition for a patent by NGK Insulators Ltd against the Japanese patent applications constituting the present invention, no date given.*

* cited by examiner

Primary Examiner—Karl Group
(74) Attorney, Agent, or Firm—Oblon, Spivak, McClelland, Maier & Neustadt, P.C.

(57) ABSTRACT

An objective of the present invention is to provide an aluminum nitride sintered body making it possible to keep a volume resistivity of $10^8$ Ω·cm or more, and guarantee covering-up capability, a large radiant heat amount and measurement accuracy with a thermoviewer. A carbon-containing aluminum nitride sintered body of the present invention of the present invention comprising: carbon whose peak cannot be detected on its X-ray diffraction chart or whose peak is below its detection limit thereon; in a matrix made of aluminum nitride.

2 Claims, 16 Drawing Sheets

Fig. 4
(a)
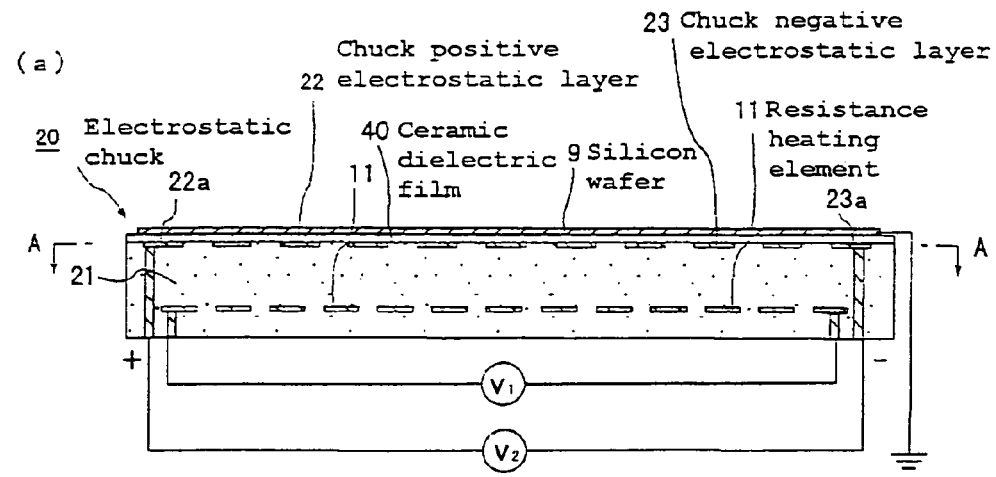
(b)
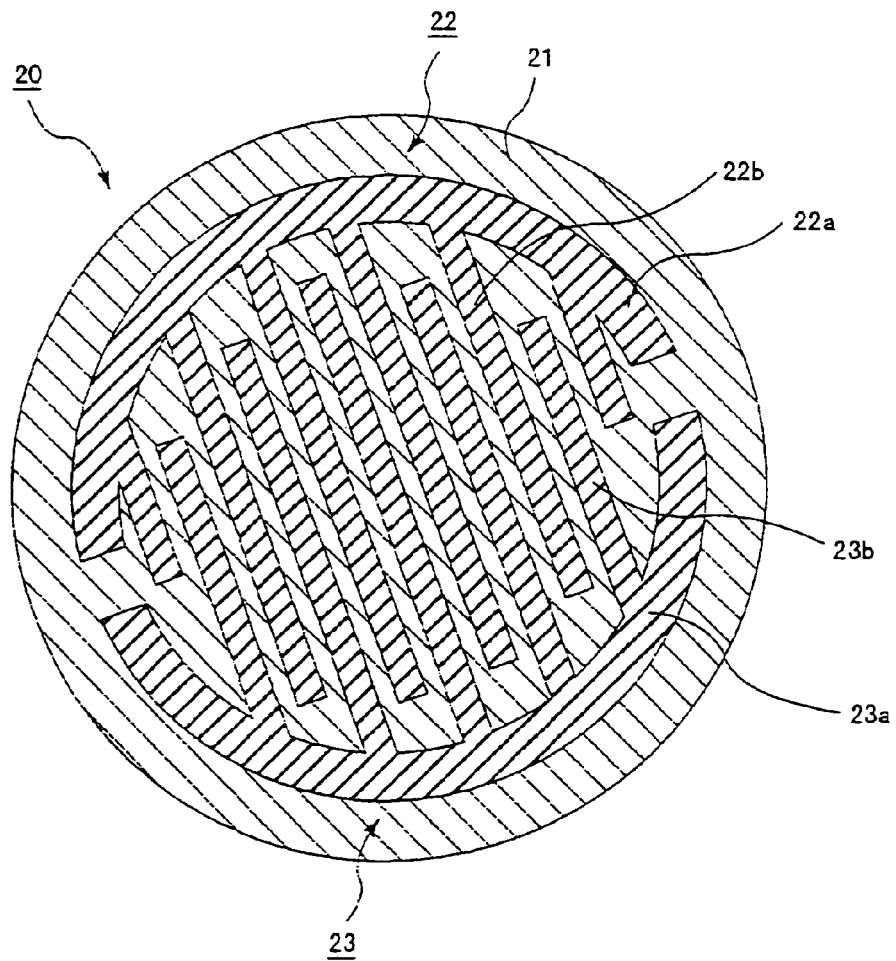

CARBON-CONTAINING ALUMINUM NITRIDE SINTERED COMPACT AND CERAMIC SUBSTRATE FOR USE IN EQUIPMENT FOR MANUFACTURING OR INSPECTING SEMICONDUCTOR

TECHNICAL FIELD

The present invention relates to an aluminum nitride sintered body used as a material which constitutes a hot plate, an electric static chuck, a wafer prober, a susceptor and the like mainly in the semiconductor industry; and relates particularly to a carbon-containing aluminum nitride sintered body superior in capability of covering up an electrode pattern and so on, volume resistivity at high temperature, and accuracy of temperature-measurement with a thermoviewer.

The present invention also: relates to a ceramic substrate, wherein a ceramic made of the above-mentioned aluminum nitride sintered body and the like is used, the ceramic substrate being used as a semiconductor producing or examining device such as a hot plate, an electrostatic chuck or a wafer prober; and relates particularly to a ceramic substrate, for a semiconductor producing/examining device, which is superior in capability of covering up an electrode pattern and so on, volume resistivity at high temperature, and accuracy of temperature-measurement with a thermoviewer.

BACKGROUND ART

Hitherto, a heater, a wafer prober and the like, using a metal base material such as stainless steel or aluminum alloy, has been used in semiconductor producing or examining devices comprising an etching device, a chemical vapor deposition device and the like.

However, a heater made of a metal has problems that its temperature controllability is poor and its thickness also becomes thick so that the heater is heavy and bulky. The heater also has a problem that corrosion resistance against corrosive gas is poor.

To solve these problems, JP Kokai Hei 11-40330 suggests a heater wherein a ceramic such as aluminum nitride is used instead of a metal.

However, aluminum nitride itself, which is a base material constituting this heater, is generally white or light gray; therefore, it is not preferred for the use of a heater or a susceptor. Whereas, color of black has a larger radiant heat amount, therefore it is suitable for such a kind use. Color of black is particularly preferred for the use of a wafer prober or an electrostatic chuck since it has a high capability of covering up an electrode pattern. Furthermore, when the surface temperature of a heater is measured with a thermoviewer (surface thermometer) in the case of the substrate being white or light gray, the amount of radiant heat thereof does not become constant so that accurate measurement of the temperature has been impossible.

In inventions in the prior art which are disclosed in JP Kokai Hei 9-48668 and the like, which are developed to comply with such a demand, is suggested a ceramic base material to which, crystalline carbon whose peak is detected at a position of 44 to 45° in its X-ray diffraction chart, is added.

SUMMARY OF THE INVENTION

However, the ceramic base material in the prior art, to which such crystalline carbon (graphite) is added, has a problem that its volume resistivity at high temperature, for example, at a high temperature range of 500° C. drops below $1 \times 10^8$ $\Omega \cdot cm$ (reference to FIG. 1).

An objective of the present invention is to: solve the problems which the above-mentioned prior art embraces; and provide an aluminum nitride sintered body wherein: its volume resistivity thereof at a high temperature, particularly at about 500° C., can be kept at $10^8$ $\Omega \cdot cm$ or more at least; and covering-up capability, a large radiant heat amount, and measurement accuracy with a thermoviewer can be assured.

Another objective of the present invention is to provide a ceramic substrate for a semiconductor-producing/examining device, which is useful for a hot plate, an electrostatic chuck, a wafer prober or a susceptor,: wherein leakage current and short circuits are not generated since the volume resistivity, particularly at a high temperature of 200° C. or higher, is sufficiently high; and wherein covering-up capability, a large radiant heat amount and measurement accuracy with a thermoviewer can be assured.

An aluminum nitride sintered body of a first aspect of the present invention has been developed to meet the above-mentioned demands, and is a carbon-containing aluminum nitride sintered body, comprising carbon: whose peak cannot be detected on its X-ray diffraction chart or whose peak is below its detection limit thereon; in a matrix made of aluminum nitride.

In the aluminum nitride sintered body, carbon whose peak cannot be detected on its X-ray diffraction chart or whose peak is below its detection limit thereon is desirably at least one of amorphous carbon, and carbon forming solid solution in the phase of aluminum nitride crystal. The content of the carbon is desirably from 200 to 5000 ppm.

An aluminum nitride sintered body of a second aspect of the present invention is a carbon-containing aluminum nitride sintered body, comprising both of: carbon whose peak cannot be detected on its X-ray diffraction chart or whose peak is below its detection limit thereon; and carbon whose peak can be detected thereon;

in a matrix made of aluminum nitride.

In the aluminum nitride sintered body, the carbon whose peak cannot be detected on its X-ray diffraction chart or whose peak is below its detection limit thereon is desirably at least one of amorphous carbon and carbon forming solid solution in the phase of aluminum nitride crystal; and the carbon whose peak can be detected thereon is desirably crystalline carbon. An embodiment which comprises the amorphous carbon and the crystalline carbon is particularly desirable.

The content of the total of the carbon is desirably from 200 to 5000 ppm.

In the aluminum nitride sintered bodies of the first and second aspects of present inventions, the matrix desirably contains a sintering aid comprising at least one of an alkali metal oxide, an alkali earth metal oxide, and a rare earth oxide.

About the aluminum nitride sintered bodies, their brightness defined in JIS Z 8721 is desirably N4 or less.

A ceramic substrate for the semiconductor-producing/examining device of a third aspect of the present invention has been developed to meet the above-mentioned demands, and is a ceramic substrate for a semiconductor-producing/examining device, wherein: a ceramic substrate comprising carbon whose peak cannot be detected on its X-ray diffraction chart or whose peak is below its detection limit thereon, is provided with a conductor.

In the ceramic substrate for a semiconductor-producing/examining device, the carbon whose peak cannot be detected on its X-ray diffraction chart or whose peak is below its detection limit thereon is desirably at least one of amorphous carbon, and carbon forming solid solution in the phase of ceramic crystal. The content of the carbon is desirably from 200 to 5000 ppm.

A ceramic substrate for a semiconductor-producing/examining device, of a fourth aspect of the present invention, is a ceramic substrate for a semiconductor-producing/examining device,
wherein a ceramic substrate: comprising both of:
carbon whose peak cannot be detected on its X-ray diffraction chart or whose peak is below its detection limit thereon; and carbon whose peak can be detected thereon,
is provided with a conductor.

In the ceramic substrate for the semiconductor-producing/examining device, the carbon whose peak cannot be detected on its X-ray diffraction chart or whose peak is below its detection limit thereon is desirably at least one of the amorphous carbon, and the carbon forming solid solution in the phase of aluminum nitride crystal. The carbon whose peak can be detected thereon is desirably crystalline carbon. The content of the carbon is desirably from 200 to 5000 ppm.

The ceramic substrates for the semiconductor-producing/examining device of the third and fourth aspects present inventions desirably contains a sintering aid comprising at least one of an alkali metal oxide, an alkali earth metal oxide, and a rare earth oxide.

Regarding the substrates for the semiconductor-producing/examining device, their brightness defined in JIS Z 8721 is desirably N4 or less.

In the ceramic substrates for the semiconductor-producing/examining device of the third and fourth aspects of present inventions, it is desired: that the conductor is an electrostatic electrode and the ceramic substrate functions as an electrostatic chuck; or that the conductor is a resistance heating element and the ceramic substrate functions as a hot plate.

It is also desired that the conductor is formed: on a surface of the ceramic substrate; and inside the ceramic substrate,
the inside conductor is at least one of a guard electrode and a ground electrode,
and the ceramic substrate functions as a wafer prober.

BRIEF DESCRIPTION OF DRAWINGS

FIG. 4(a) is a vertical sectional view which schematically illustrates an electrostatic chuck, and FIG. 4(b) is a sectional view taken along A—A line of the electrostatic chuck illustrated in FIG. 4(a).

Figure 1:
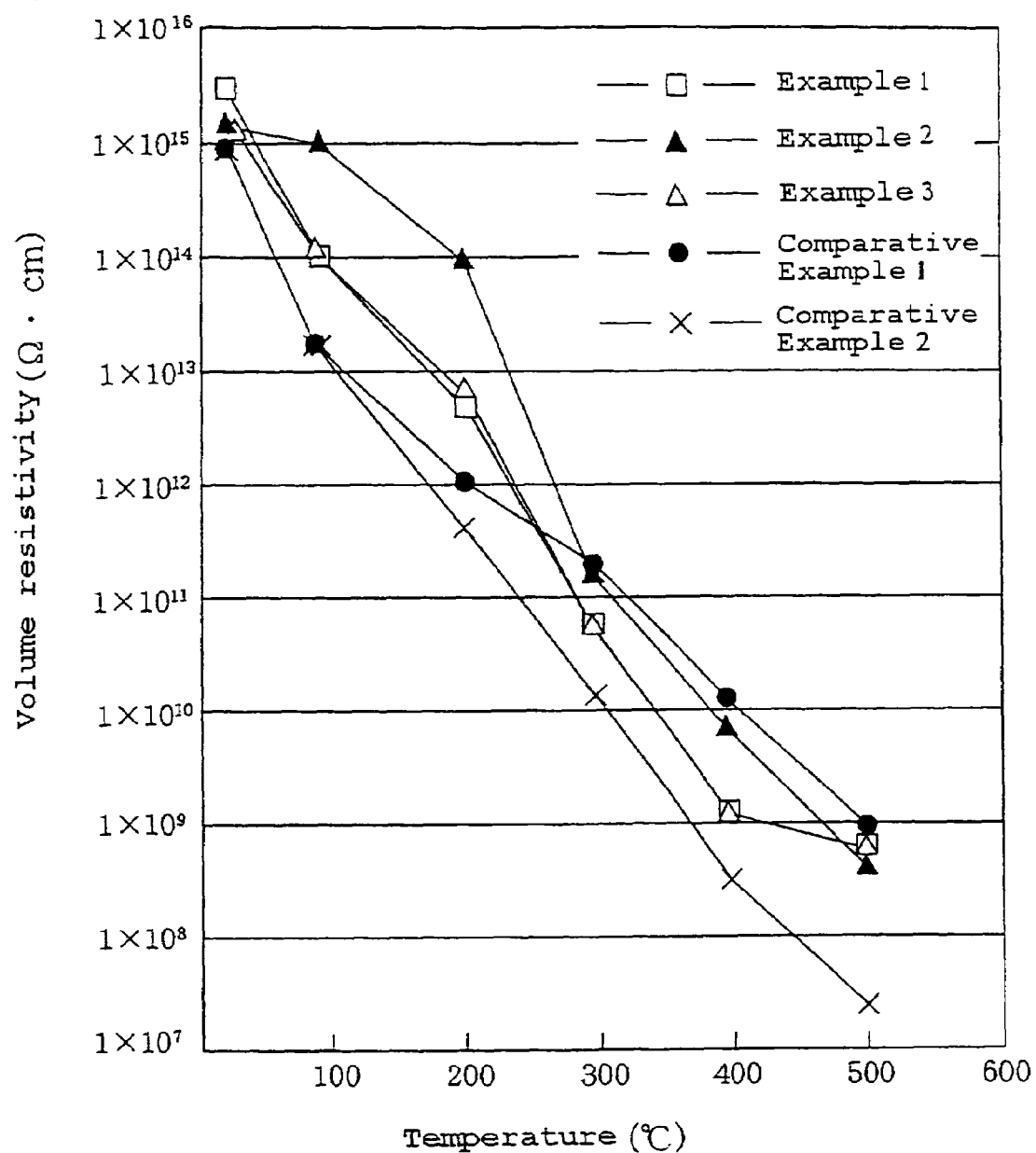
FIG. 1 is a graph showing a relationship between the volume resistivity and the temperature of aluminum nitride sintered bodies according to Examples 1 to 3 and Comparative Examples 1, 2.

| Explanation of symbols | |
|---|---|
| 2 | chuck top conductor layer |
| 3 | ceramic substrate |
| 5 | guard electrode |
| 6 | ground electrode |
| 7 | groove |
| 8 | air suction hole |
| 16, 17 | plated through hole |
| 19, 190, 191 | external terminal pin |
| 20, 70, 80 | electrostatic chuck |
| 21, 71, 81 | aluminum nitride substrate |
| 22, 72, 82a, 82b | chuck positive electrostatic layer |
| 23, 73, 83a, 83b | chuck negative electrostatic layer |
| 41 | resistance heating element |
| 180 | blind hole |

DETAILED DISCLOSURE OF THE INVENTION

First, the aluminum nitride sintered body of the first aspect of the present invention will be described.

The aluminum nitride sintered body of the first aspect of the present invention is a carbon-containing aluminum nitride sintered body comprising: carbon whose peak cannot be detected on its X-ray diffraction chart or whose peak is below its detection limit thereon; in a matrix made of aluminum nitride.

Research by the inventors demonstrated that: regarding a ceramic substrate comprising an aluminum nitride sintered body containing carbon whose peak is detected at positions where the diffraction angle 2θ is 10 to 90°, particularly 2θ is 44 to 45° on its X ray diffraction chart, its volume resistivity at a high temperature (500° C.) is lowered to $0.5 \times 10^7$ Ω·cm, therefore a short circuit is caused between heating element patterns or between electrode patterns thereof when the ceramic substrate is heated.

The reason for this can be considered as follows, since: the volume resistivity of an aluminum nitride sintered body is lowered at high temperature; and crystalline carbon has a crystal structure similar to metal crystal, and has a large electric conductivity at high temperature, these two properties act synergistically to result in the above-mentioned short circuit.

The inventors continued to make further investigations on this fact. As a result, it has been found that in order to lower the electric conductivity of carbon at high temperature, there should be used: carbon whose crystallinity is lowered to such a degree that no peak is detected on its X-ray diffraction chart; or carbon forming solid solution in the crystal phase: that is, carbon whose peak is not detected on the X-ray diffraction chart.

The wording "carbon whose peak cannot be detected on the X-ray diffraction chart" means that no peak of carbon can be detected at positions where the diffraction angle 2θ is 10 to 90°, particularly 44 to 45°. The reason why the wording is defined as above is as follows: since carbon can have various crystal systems, as disclosed in JP Kokai Hei 9-48668, not only a peak which shows its appearance at a position where the diffraction angle 2θ is 44 to 45° but also crystal of carbon whose peak shows its appearance at positions where the diffraction angle 2θ is 10 to 90° must be considered (reference to FIGS. 2, 3).

It is not preferred that halo, as well as the peak, shows its appearance on the X-ray diffraction chart. The amorphous body usually has a gentle slope, called halo, near positions where 2θ is 15 to 40°, therefore, the fact that such halo shows its appearance means that amorphous carbon has been making an invasion into the phase of aluminum nitride crystal. As a result, the crystallinity of aluminum nitride is lowered, and also the sinterability thereof is hindered so that the brightness becomes high. Moreover, the strength at high temperature is lowered.

Specific examples of the method for preparing carbon whose peak cannot be detected on the X-ray diffraction chart include:

(1) a method of forming solid-solution of carbon in the phase of aluminum nitride crystal not to cause any X-ray diffraction peak resulting from carbon crystal to show its appearance; and (2) a method of using amorphous carbon.

Among these methods, the method (2) of using amorphous carbon is preferred. The reason for this is that: if carbon is forming solid-solution in aluminum nitride, defects are generated in the crystal so that the strength at high temperature is lowered.

JP Kokai Hei 9-48668 describes a phenomenon that crystalline carbon forms solid-solution in aluminum nitride when heated at a temperature of 1850° C. so that the X-ray diffraction peak disappears. However, though, in the invention disclosed in JP Kokai Hei 9-48668, a product wherein the X-ray diffraction peak is present at 44 to 45° is recognized as the invention, the publication neither describes nor suggests volume resistivity thereof at high temperature.

The aluminum nitride sintered body of the first aspect of the present invention has novel physical property that: a carbon-containing sintered body does not have any peak showing its appearance at positions where the diffraction angle 2θ is 10 to 90° on the X ray diffraction chart, and at the same time, it has a volume resistivity of $10^8$ Ω·cm or more at the temperature range of 25 to 500° C. Therefore, the novelty and inventive step of the first aspect of the present invention can never be rejected by the description of JP Kokai Hei 9-48668.

In the first aspect of the present invention, the content of carbon whose peak cannot be detected on its X-ray diffraction chart or whose peak is below its detection limit thereon is desirably set to 200 to 5000 ppm. If the amount is below 200 ppm, it cannot be said that the aluminum nitride sintered body is black and it has a brightness over N4. If the amount is over 5000 ppm, the sinterability of aluminum nitride is lowered Particularly, the content is optimally from 200 to 2000 ppm.

In the first aspect of the present invention, it is desired that the aluminum nitride sintered body constituting a matrix comprises a sintering aid. As the sintering aid, an alkali metal oxide, an alkali earth metal oxide or a rare earth oxide can be used. CaO, $Y_2O_3$, $Na_2O$, $Li_2O$ and $Rb_2O$ are particularly preferred The content thereof is desirably from 0.1 to 10% by weight.

In the aluminum nitride sintered body according to the first aspect of the present invention, its brightness defined in JIS Z 8721 is desirably N4 or less. This is because the sintered body having such a brightness is superior in radiant heat amount and covering-up ability.

The brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case is made to 0 or 5.

The following will describe an example of a process for producing the aluminum nitride sintered body of the first aspect of the present invention.

(1) First, amorphous carbon is produced. For example, a hydrocarbon consisting only of C, H and O, preferably a saccharide (sucrose or cellulose) is fired at a temperature of 300 to 500° C. in air, so as to produce pure amorphous carbon.

(2) Next, the above-mentioned carbon is mixed with aluminum nitride powder, which will be a matrix component. About the size of the mixed powder, the average particle diameter thereof is preferably as small as about 0.1 to 5 μm. This is because the sinterability thereof is improved as the size thereof is finer. The added amount of the carbon is decided under consideration of the lost amount at the time of firing.

A sintering aid, such as the above-mentioned yttrium oxide (yttria: $Y_2O_3$), may be added to the above-mentioned mixture.

Instead of the above-mentioned steps (1), (2), it is allowable to adopt the following steps: aluminum nitride powder, a binder, a saccharide and a solvent are mixed to produce green sheets; the green sheets are laminated; and the lamination of the green sheets is pre-fired at a temperature of 300 to 500° C. to make the saccharide into amorphous carbon. In this case, both of the saccharide and amorphous carbon may be added. As the solvent, α-terpineol, glycol and the like may be used.

(3) Next, the formed body prepared by putting the resultant powdery mixture into a mold, or the above-mentioned lamination of the green sheets (either of which is pre-fired) is heated and pressed at a temperature of 1700 to 1900° C., and at a pressure of 80 to 200 kgf/cm² in the atmosphere of an inert gas such as argon or nitrogen, so as to be fired.

At the production of the aluminum-nitride sintered body of the first aspect of the present invention, by embedding a metal plate, a metal wire and the like, which will be resistance heating elements, in the powdery mixture, at the time of putting the powdery mixture into the mold; or by forming a conductor containing paste layer, which will be resistance heating elements, on one green sheet out of the laminated green sheets, a ceramic heater having the aluminum nitride sintered body as a substrate can be produced.

After producing the sintered body, by: forming a conductor containing paste layer on the surface (bottom surface) thereof; and firing the product, heating elements can be formed on the bottom surface.

Furthermore, at the time of producing this ceramic heater: a metal plate (foil) and the like, as well as the heating elements, maybe embedded in the above-mentioned formed body; or a conductor containing paste layer may be formed on the green sheets, so as to have a shape of an electrode such as an electrostatic chuck. In this way, a hot plate, an electrostatic chuck, a wafer prober, a susceptor and the like can be produced.

The conductor containing paste for producing various electrodes or heating elements is not particularly limited, and is preferably a paste comprising not only metal particles or a conductive ceramic for keeping electric conductivity but also a resin, a solvent, a thickener and so on.

The metal particles are preferably made of, for example, a noble metal (gold, silver, platinum and palladium), lead, tungsten, molybdenum, nickel and the like. These may be used alone or in combination of two or more. These metals are not relatively easily oxidized and have a sufficiently large conductivity. They have a sufficient resistance value for generating heat.

Examples of the conductive ceramic include carbides of tungsten and molybdenum and the like. These may be used alone or in combination of two or more.

The particle diameter of these metal particles or the conductive ceramic is preferably 0.1 to 100 $\mu$m. If the particle diameter is too fine, that is, below 0.1 $\mu$m, they are easily oxidized. On the other hand, if the particle diameter is over 100 $\mu$m, they are not easily sintered so that the resistance value becomes large.

The shape of the metal particles may be spherical or scaly. When these metal particles are used, they may be a mixture of spherical particles and scaly particles.

In the case that the metal particles are scaly or a mixture of spherical particles and scaly particles, metal oxides between the metal particles are easily retained and adhesiveness between the heating elements and the nitride ceramic and the like is made sure. Moreover, the resistance value can be made large. Thus, this case is profitable.

Examples of the resin used in the conductor containing paste include epoxy resins, phenol resins and the like. Examples of the solvent are isopropyl alcohol and the like. Examples of the thickener are cellulose and the like.

When the conductor containing paste for the heating elements is formed on the surface of the sintered body, it is desired to add a metal oxide besides the metal particles to the conductor containing paste and sinter the metal particles and the metal oxide. By sintering the metal oxide together with the metal particles in this way, the aluminum nitride sintered body can be closely adhered to the metal particles.

The reason why the adhesiveness to the aluminum nitride sintered body by mixing the metal oxide is improved is unclear, but would be based on the following. The surface of the metal particles and the surface of the aluminum nitride sintered body are slightly oxidized so that an oxidized film is formed thereon. Pieces of these oxidized films are sintered and integrated with each other through the metal oxide so that the metal particles and the nitride ceramic are closely adhered to each other.

A preferred example of the metal oxide is at least one selected from the group consisting of lead oxide, zinc oxide, silica, boron oxide ($B_2O_3$), alumina, yttria, and titania.

These oxides make it possible to improve adhesiveness between the metal particles and the nitride ceramic without increasing the resistance value of the heating elements.

When the total amount of the metal oxides is set to 100 parts by weight, the weight ratio of lead oxide, zinc oxide, silica, boron oxide ($B_2O_3$) alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The ratio is preferably adjusted within the scope that the total thereof is not over 100 parts by weight.

By adjusting the amounts of these oxides within these ranges, the adhesiveness to the aluminum nitride sintered body can be particularly improved.

The addition amount of the metal oxides to the metal particles is preferably 0.1% by weight or more and less than 10% by weight. The area resistivity when the conductor containing paste having such a composition is used to form the heating elements is preferably from 1 to 45 m$\Omega$/□.

If the area resistivity is over 45 m$\Omega$/□, the carolific value for an applied voltage becomes too large so that, in the aluminum nitride substrate wherein the heating elements are set on its surface, their carolific value is not easily controlled. If the added amount of the metal oxide is 10% by weight or more, the area resistivity exceeds 50 m$\Omega$/□ so that the carolific value becomes too large. Thus, temperature-control becomes difficult and the uniformity of the temperature distribution becomes poor.

In the case that the heating elements are formed on the surface of the aluminum nitride substrate, a metal covering layer is preferably formed on the surface of the heating elements. The metal covering layer prevents a change in the resistance value of the inner metal sintered body based on oxidization thereof. The thickness of the formed metal covering layer is preferably from 0.1 to 10 $\mu$m.

The metal used when the metal covering layer is formed is not particularly limited if the metal is a non-oxidizable metal. Specific examples thereof include gold, silver, palladium, platinum, nickel and the like. These may be used alone or in combination of two or more. Among these metals, nickel is preferred.

In the case that the heating elements are formed inside the ceramic substrate, no coating is necessary since the surface of the heating elements is not oxidized.

The following will describe an aluminum nitride sintered body of the second aspect of the present invention.

The aluminum nitride sintered body of the second aspect of the present invention is a carbon-containing aluminum nitride sintered body comprising both of:

carbon whose peak cannot be detected on its X-ray diffraction chart or whose peak is below its detection limit thereon; and carbon whose peak can be detected thereon, in a matrix made of aluminum nitride.

In the aluminum nitride sintered body comprising carbon whose peak is detected on the X-ray diffraction chart, crystalline carbon has a crystal structure similar to metal crystal, and has a large electric conductivity at high temperature, so that the volume resistivity thereof at high temperature (500° C.) is lowered to $0.5 \times 10^7$ Ω·cm. Therefore, at the time of heating, a short circuit may be generated between heating element patterns or between electrode patterns, and the electric conductivity of carbon at high temperature is lowered. To solve this problem, it is necessary to use: carbon whose crystallinity is lowered to such a degree that no peak can be detected on its X-ray diffraction chart; or carbon forming solid-solution in the crystal phase; that is, carbon whose peak is not detected on the X-ray diffraction chart, as described above.

However, if carbon whose crystallinity is lowered to such a degree that no peak can be detected on the X-ray diffraction chart is added to a matrix of aluminum nitride, a problem that thermal conductivity at high temperature drops, may be caused. This would be because amorphous carbon is interposed in the interface between grains to become a barrier which blocks the conduction of heat.

Thus, the inventors made further investigations. As a result, the inventors have found that by causing: crystalline carbon having a crystal structure similar to metal crystal and having a thermal conductivity which is not easily lowered at high temperature; to coexist with amorphous carbon, a drop in the thermal conductivity at high temperature can be suppressed.

It has been found that if two kinds of the carbon are comprised therein in this way, the volume resistivity at high temperature can be made to at least $10^8$ Ω·cm or more and the thermal conductivity at high temperature can be made to 60 W/m·k or more, thereby overcoming the problem of the drop in the thermal conductivity which occurs when amorphous carbon alone is added.

In the aluminum nitride sintered body of the second aspect of the present invention, a specific method for preparing carbon whose peak cannot be detected on the X-ray diffraction chart or whose peak is below its detection limit thereon may be, for example, the same method as in the first aspect of the present invention.

As the crystalline carbon comprised in the matrix, ordinary graphite or carbon black may be used.

The blend ratio of carbon whose peak cannot be detected on its X-ray diffraction chart or whose peak is below its detection limit thereon to carbon whose peak can be detected thereon (crystalline carbon) is adjusted within the range of, preferably from 1/200 to 200/1, more preferably from 1/100 to 100/1 (weight ratio) if possible.

The ratio of two kinds of the carbon is measured by laser Raman spectroscopy. In the laser Raman spectroscopy, the peak of crystalline carbon (Raman shift: 1580 cm$^{-1}$) and the peak of amorphous carbon (Raman shift: 1355 cm$^{-1}$) show their appearances separately. Therefore, the blend ratio can be understood from the ratio between the heights of the two peaks.

The total amount of the added amounts of the two kinds of carbon is desirably set to 200 to 5000 ppm. If the total amount is below 200 ppm, it cannot be said that the resultant aluminum nitride sintered body is black, and the sintered body has a brightness over N4. On the other hand, if the added amount is over 5000 ppm, the sinterability of the aluminum nitride becomes poor. Particularly, the added amount of the two kinds of carbon is desirably set to 200 to 2000 ppm.

In the second aspect of the present invention, the aluminum nitride sintered body constituting the matrix desirably comprises a sintering aid. As the sintering aid, the same as in the first aspect of the present invention, and the like may be used. The content thereof is desirably 0.1 to 10% by weight in the same way as in the first aspect of present invention.

The brightness defined in JIS Z 8721 of the carbon-containing aluminum nitride sintered body of the second aspect of the present invention is desirably N4 or less for the same reason as in the first aspect of the present invention.

The aluminum nitride sintered body of the second aspect of the present invention can be produced using, for example, the following process and the like. That is, in the process for producing the aluminum nitride sintered body of the first aspect of the present invention, at the time of mixing carbon with aluminum nitride powder [the step (2) in above-mentioned example of the process for producing the aluminum nitride sintered body of the first aspect of the present invention], crystalline carbon, such as graphite or carbon black, together with amorphous carbon is added. Other steps are performed in the same way as in the first aspect of the present invention.

At the production of the aluminum nitride sintered body of the second aspect of the present invention, by embedding a metal plate, a metal wire and the like, which will be resistance heating elements, in the powdery mixture, at the time of putting the powdery mixture into the mold; or by forming a conductor containing paste layer, which will be resistance heating elements, on one green sheet out of the laminated green sheets, a ceramic heater having the aluminum nitride sintered body as a substrate can be produced.

Also, after producing the sintered body, by: forming a conductor containing paste layer on the surface (bottom surface) thereof; and firing the product, heating elements can be formed on the bottom surface.

Furthermore, at the time of producing this ceramic heater: a metal plate (foil) and the like, as well as the heating elements, may be embedded in the above-mentioned formed body; or a conductor containing paste layer may be formed on the green sheets, so as to have a shape of an electrode such as an electrostatic chuck. In this way, a hot plate, an electrostatic chuck, a wafer prober, a susceptor and the like can be produced.

The conductor containing paste for producing various electrodes or heating elements is the same as in the first aspect of the present invention, and the like.

The following will describe the ceramic substrate, for a semiconductor-producing/examining device, of the present invention.

The ceramic substrate for a semiconductor-producing/examining device of the third aspect of the present invention (which may be referred to merely as a ceramic substrate for a semiconductor device hereinafter) is: a ceramic substrate comprising carbon whose peak cannot be detected on its X-ray diffraction chart or whose peak is below its detection limit thereon; for example, a ceramic substrate using the aluminum nitride sintered body of the first aspect of the present invention and the like, is provided with a conductor.

Research by the inventors demonstrated that: regarding a ceramic substrate comprising carbon whose peak is detected at positions where the diffraction angle 2θ is 10 to 90°, particularly 2θ is 44 to 45° on its X-ray diffraction chart, its volume resistivity at a high temperature of 200° C. or higher is largely lowered, and therefore, a leakage current or a short circuit is caused between heating element patterns or between electrode patterns when the ceramic substrate is heated.

The reason for this can be considered as follows: the volume resistivity of a ceramic substrate is more largely lowered at higher temperature; crystalline carbon has a crystal structure similar to metal crystal, and it has a large electric conductivity at high temperature; and these two properties act synergistically to result in the above-mentioned short circuit.

The inventors continued to make further investigations in order to prevent such a short circuit and increase the electric resistivity of the ceramic substrate. As a result, it has been found that in order to increase the electric resistivity of the carbon-containing ceramic substrate at high temperature, there should be used: carbon whose crystallinity is lowered to such a degree that no peak is detected on its X-ray diffraction chart; or carbon forming solid-solution in the crystal phase; that is, carbon whose peak is not detected on the X-ray diffraction chart.

The wording "carbon whose peak cannot be detected on the X-ray diffraction chart" means that no peak of carbon can be detected at positions where the diffraction angle $2\theta$ is 10 to 90°, particularly 44 to 45° in the same way as in the aluminum nitride sintered body of the present invention.

It is not preferred that halo, as well as the peak, shows its appearance on the X-ray diffraction chart. The amorphous body usually has a gentle slope, called halo, near positions where $2\theta$ is 15 to 40°, but the fact that such halo shows its appearance means that amorphous carbon has been making an invasion into the crystal of nitride, oxide and the like, which constitutes the ceramic substrate. Therefore, the crystallinity of the nitride and the like is lowered, and the sinterability thereof is hindered so that the brightness becomes high. Moreover, the strength at high temperature is lowered.

Specific examples of the method for preparing carbon whose peak cannot be detected on the X-ray diffraction chart include (1) a method of forming a solid-solution of carbon in the crystal phase of the compound constituting the ceramic not to cause any X-ray diffraction peak resulting from carbon crystal to show its appearance; and (2) a method of using amorphous carbon.

Among these methods, the method (2) of using amorphous carbon is preferred. The reason for this is that if carbon is forming a solid-solution in the sintered body, defects are easily generated in the crystal so that the strength of the sintered body at high temperature is lowered.

In the third aspect of the present invention, the content of carbon whose peak cannot be detected on its X-ray diffraction chart or whose peak is below its detection limit thereon is preferably set to 200 to 5000 ppm, and more preferably is set to 200 to 2000 ppm. If the content is below 200 ppm, it cannot be said that the aluminum nitride sintered body is black, and it has a brightness over N4. If the added amount is over 5000 ppm, the sinterability of the ceramic substrate becomes poor.

The ceramic material constituting the ceramic substrate for a semiconductor device of the third aspect of the present invention is not especially limited. Examples thereof include nitride ceramics, carbide ceramics, and oxide ceramics and the like.

Examples of the nitride ceramics include metal nitride ceramics such as aluminum nitride, silicon nitride, boron nitride, titanium nitride and the like.

Examples of the carbide ceramics include metal carbide ceramics such as silicon carbide, zirconium carbide, titanium carbide, tantalum carbide, tungsten carbide and the like.

Examples of the oxide ceramics include metal oxide ceramics such as alumina, zirconia, cordierite, mullite and the like.

These ceramics may be used alone or in combination of two or more thereof.

Among these ceramics, nitride ceramics and carbide ceramics are more preferred than oxide ceramics. This is because they have a high thermal conductivity.

Aluminum nitride is most preferred among nitride ceramics since its thermal conductivity is highest, that is, 180 W/m·K.

In ceramic substrate for a semiconductor device of the third aspect of the present invention, the sintered body constituting the matrix desirably comprises a sintering aid. As the sintering aid, an alkali metal oxide, an alkali earth metal oxide or a rare earth oxide can be used. Among these sintering aids, CaO, $Y_2O_3$, $Na_2O$, $Li_2O$ and $Rb_2O$ are particularly preferred. The content thereof is desirably from 0.1 to 10% by weight.

In the ceramic substrate for a semiconductor device of the third aspect of the present invention, its brightness defined in JIS Z 8721 is desirably N4 or less. This is because the sintered body having such a brightness is superior in radiant heat amount and covering-up ability.

The ceramic substrate for a semiconductor device of the third aspect of the present invention is a ceramic substrate which is used in a device for producing or examining a semiconductor. Specific examples of the device include an electrostatic chuck, a wafer prober, a hot plate and a susceptor and the like.

On the ceramic substrate for a semiconductor device of the third aspect of the present invention, a conductor comprising a conductive metal or conductive ceramic is arranged. When this conductor is an electrostatic electrode, the ceramic substrate functions as an electrostatic chuck and the like.

Examples of the metal include noble metals (gold, silver, platinum and palladium), lead, tungsten, molybdenum, nickel and the like. Examples of the conductive ceramic include carbides of tungsten, molybdenum and the like. These may be used alone or in combination of two or more.

FIG. 4(*a*) is a vertical sectional view that schematically illustrates an electrostatic chuck. FIG. 4(*b*) is a sectional view taken along A—A line in the electrostatic chuck illustrated in FIG. 4(*a*).

In this electrostatic chuck 20, chuck positive and negative electrode layers 22, 23 are embedded in a ceramic substrate 21. A ceramic dielectric film 40 is formed on the electrodes. Resistance heating elements 11 are disposed inside the ceramic substrate 21 so that a silicon wafer 9 can be heated. If necessary, RF electrodes may be embedded in the ceramic substrate 21.

As shown in (b), the electrostatic chuck 20 is usually formed in a circular form as is viewed from the above. The chuck positive electrostatic layer 22 composed of a semicircular part 22*a* and a comb-teeth-shaped part 22*b* and the chuck negative electrostatic layer 23 composed of a semicircular part 23*a* and a comb-teeth-shaped part 23*b* are arranged oppositely to each other inside the ceramic substrate so that the comb-teeth-shaped parts 22*b* and 23*b* cross each other.

When this electrostatic chuck is used, the positive side and the negative side of a DC power source are connected to the chuck positive electrostatic layer 22 and chuck negative electrostatic layer 23, respectively. In this way, the silicon wafer put on this electrostatic chuck is electrostatically adsorbed. Accordingly, if resistance heating elements are formed inside this electrostatic chuck, heating and so on can be performed in the state that a silicon wafer is adsorbed.

Figure 5:
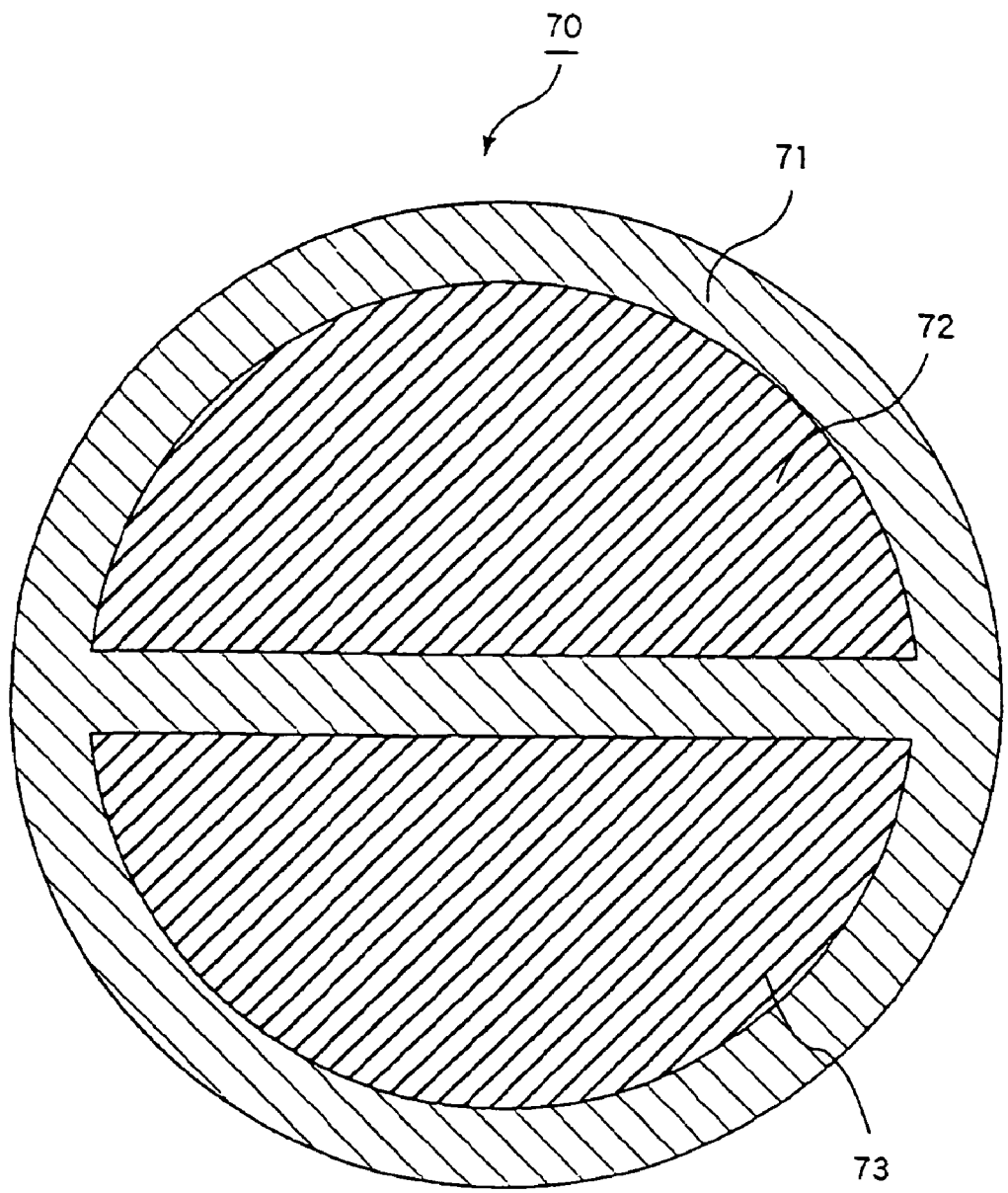
FIG. 5 is a horizontal sectional view which schematically illustrates another example of the electrostatic electrode embedded in the electrostatic chuck.
Figure 6:
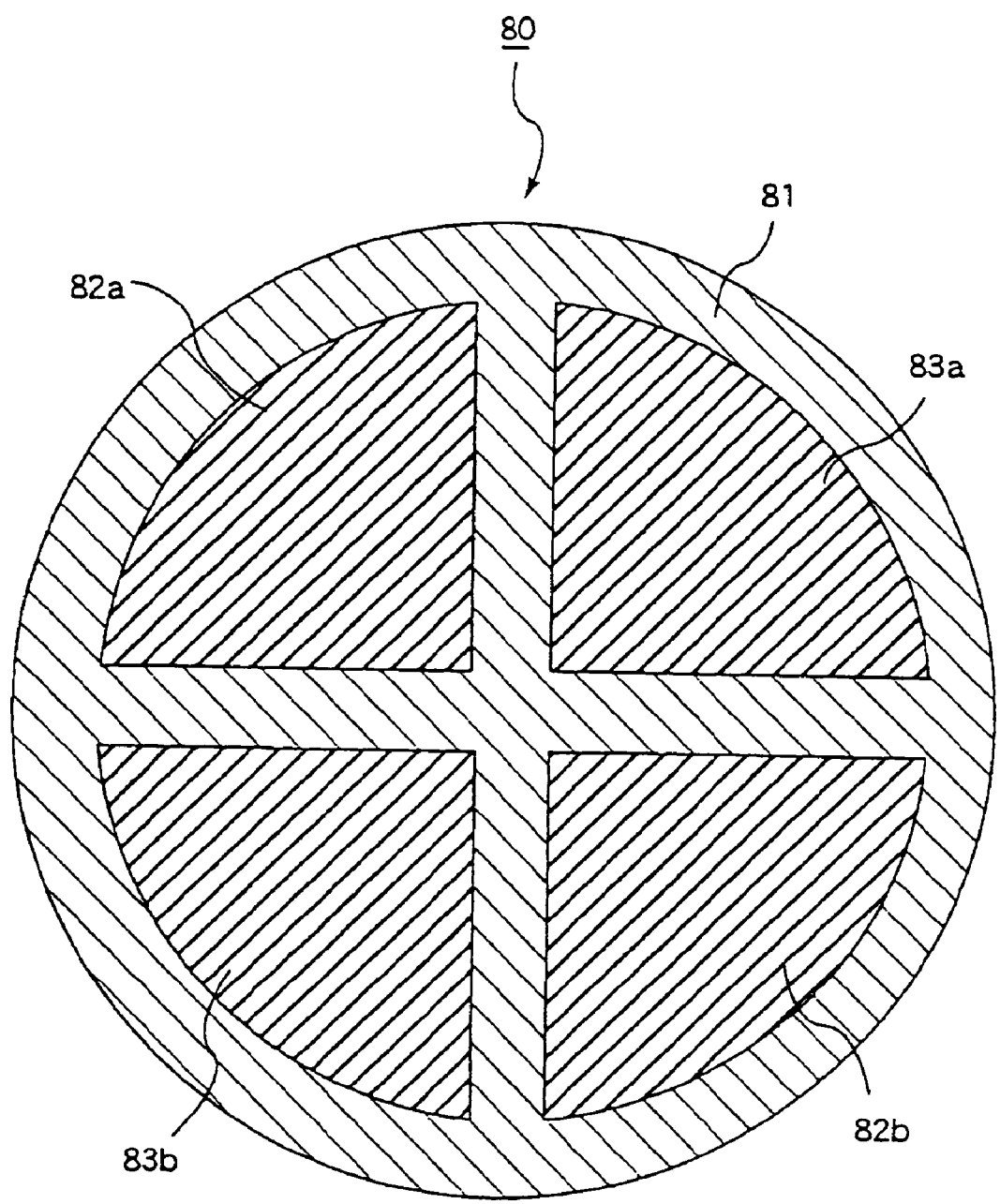
FIG. 6 is a horizontal sectional view which schematically illustrates further another example of the electrostatic electrode embedded in the electrostatic chuck.

FIGS. 5, 6 are horizontal sectional views, each of which schematically shows electrostatic electrodes in a different electrostatic chuck. In an electrostatic chuck 70 shown in FIG. 5, a chuck positive electrostatic layer 72 and a chuck negative electrostatic layer 73, each of which are in a semicircular form are formed inside a ceramic substrate 71. In an electrostatic chuck 80 shown in FIG. 6, chuck positive electrostatic layers 82a, 82b and chuck negative electrostatic layers 83a, 83b, each of which has a shape obtained by dividing a circle into 4 parts, are formed inside a ceramic substrate 81. The two chuck positive electrostatic layers 82a, 82b and the two chuck negative electrostatic layers 83a, 83b are formed to cross.

In the case that an electrode having such a form that an electrode having a circular shape and the like shape is divided is formed, the number of divided pieces is not particularly limited and may be 5 or more. Its shape is not limited to a fan-shape.

In the case that the conductor embedded in the ceramic substrate for a semiconductor device of the third aspect of the present invention is a resistance heating element, the ceramic substrate functions as a hot plate.

Figure 14:
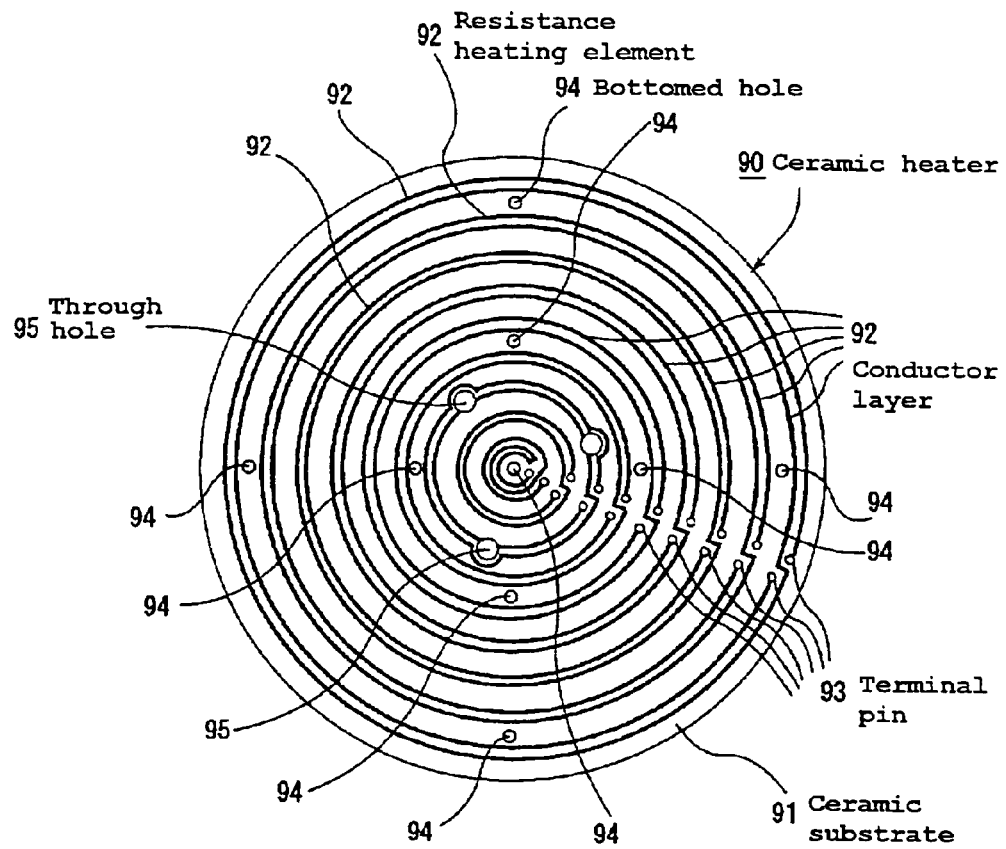
FIG. 14 is a bottom surface view which schematically illustrates a ceramic heater which is an example of the ceramic substrate for a semiconductor-producing/examining device of the present invention.
Figure 15:
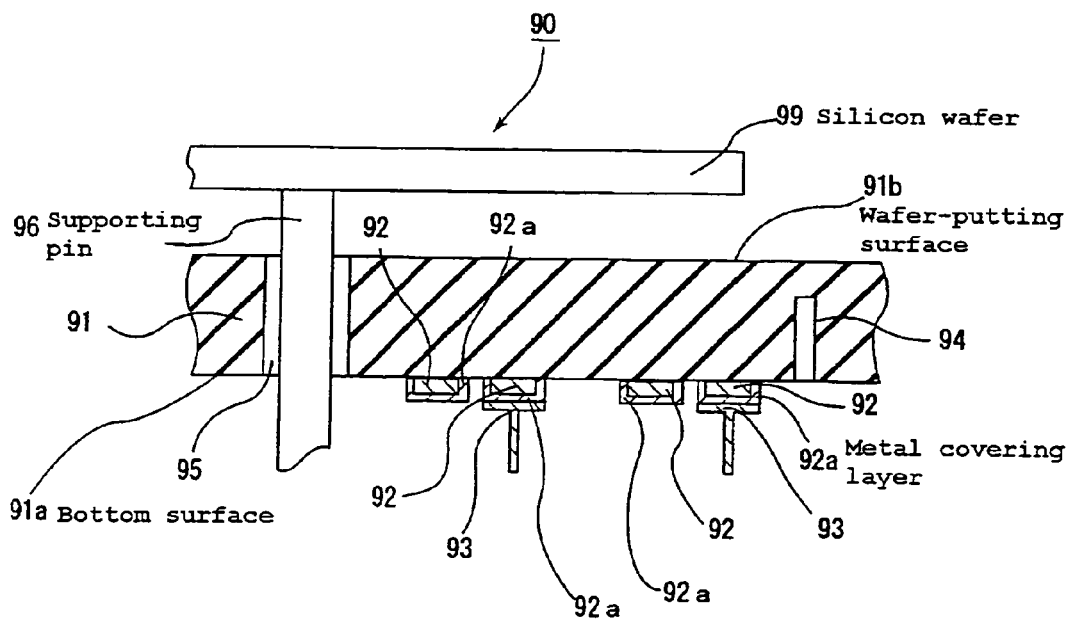
FIG. 15 is a partially enlarged sectional view which schematically illustrates the ceramic substrate illustrated in FIG. 14.

FIG. 14 is a bottom surface view that schematically illustrates an example of a hot plate (which may be referred to as a ceramic heater) that is one embodiment of the ceramic substrate for a semiconductor device of the third aspect of the present invention. FIG. 15 is a partially enlarged sectional view illustrating a part of this ceramic heater schematically.

A ceramic substrate 91 is formed in a disk form. Resistance heating elements 92 are formed in the pattern of concentric circles on the bottom surface of the ceramic substrate 91, so that the heating is conducted in the state that the temperature of the whole of the wafer-putting surface of the ceramic substrate 91 becomes uniform. A metal covering layer 92a is formed on the surface thereof.

About the resistance heating elements 92, two concentric circles near to each other, as a pair, are connected to produce one line, and terminal pins 93, which will be inputting/outputting terminal pins, are connected to both ends thereof. Through holes 95, through which supporting pins 96 will be inserted, are formed in an area near the center. Bottomed holes 94, in which temperature-measuring elements will be inserted, are formed. As shown in FIG. 15, the support pins 96, on which a silicon wafer 99 can be put, can be moved up and down. In this way, the silicon wafer 99 can be delivered to a non-illustrated carrier machine or can be received from the carrier machine.

The resistance heating elements 92 shown in FIG. 14 are arranged on the bottom surface of the ceramic substrate 91, but the resistance heating elements 92 may be formed inside the ceramic substrate 91 at the middle position thereof or at the position biased toward the wafer-putting surface from the middle position.

In the ceramic heater having such a structure, after a silicon wafer and the like is put thereon, various operations can be performed while the silicon wafer and the like is heated or cooled.

The above-mentioned ceramic substrate functions as a wafer prober in the case that a conductor is formed on a surface of the ceramic substrate for a semiconductor device of the third aspect of the present invention and inside the same ceramic substrate and the inside conductor is at least one of a guard electrode and a ground electrode.

Figure 16:
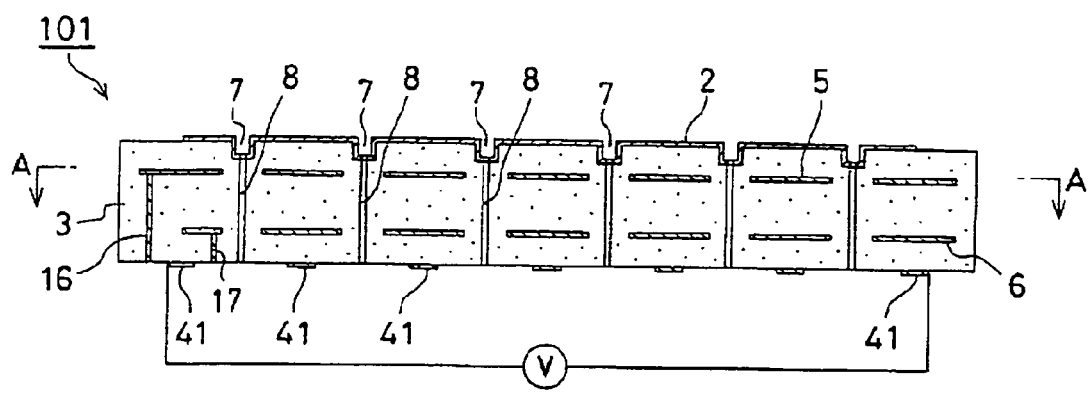
FIG. 16 is a vertical sectional view which schematically illustrates a wafer prober which is an example of the ceramic substrate for a semiconductor-producing/examining device of the present invention.
Figure 17:
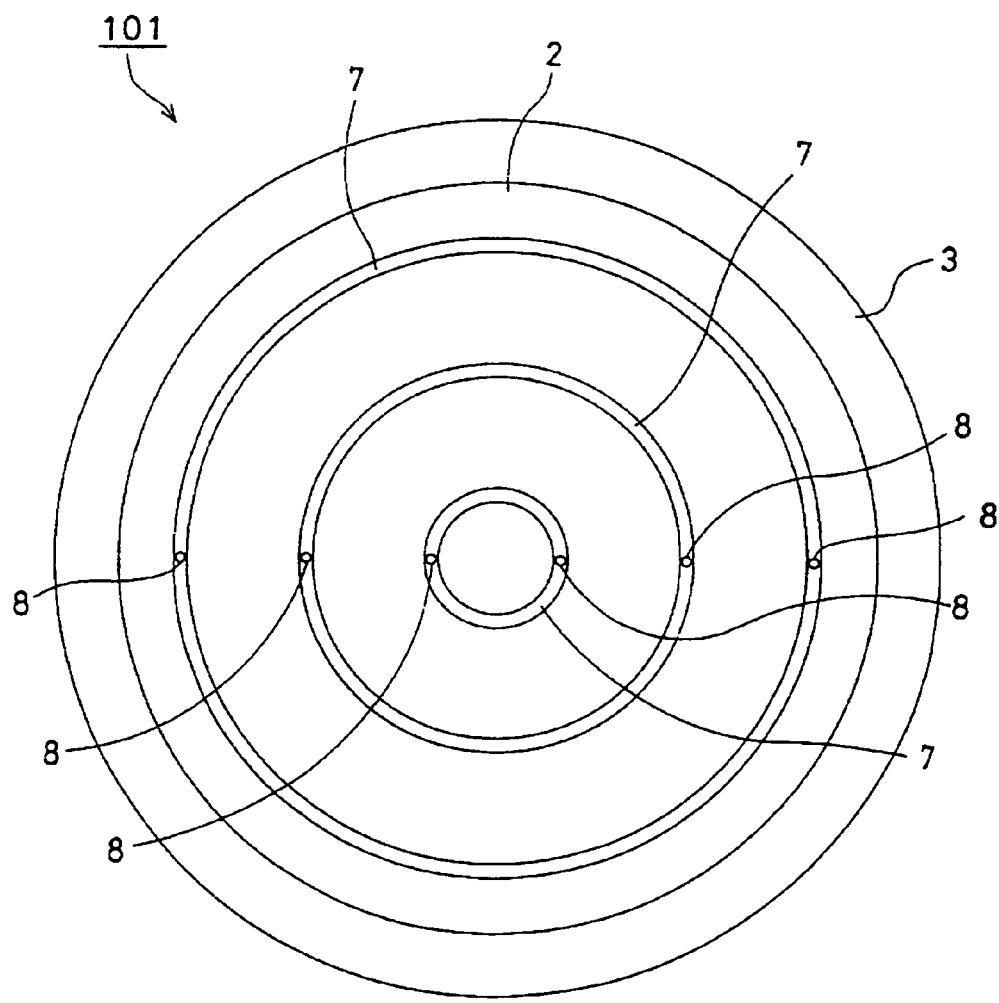
FIG. 17 is a plain view which schematically shows the wafer prober illustrated in FIG. 16.
Figure 18:
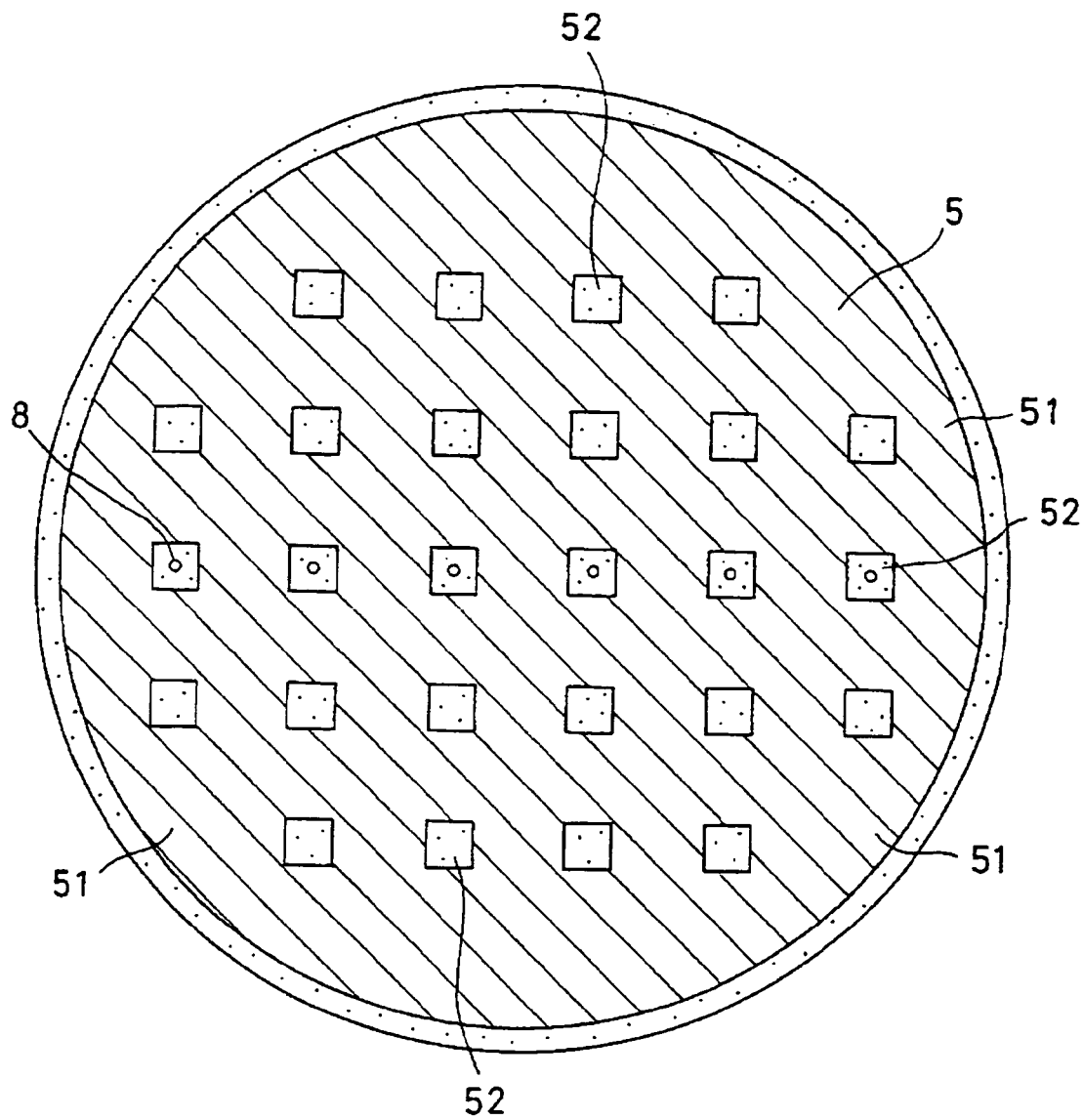
FIG. 18 is a sectional view taken along A—A line of the wafer prober illustrated in FIG. 16.

FIG. 16 is a sectional view that schematically illustrates one embodiment of a wafer prober, which is an example of the ceramic substrate for a semiconductor-producing/examining device of the third aspect of the present invention. FIG. 17 is a plain view thereof, and FIG. 18 is a sectional view taken along A—A line in the wafer prober shown in FIG. 16.

In this wafer prober 101, grooves 7 in the form of concentric circles are formed in the surface of a ceramic substrate 3 which is in a circle form as viewed from the above. Moreover, plural suction holes 8 for sucking a silicon wafer are formed in several parts of the grooves 7. A chuck top conductor layer 2 for the connection to electrodes of the silicon wafer is formed, in a circular form, in the greater part of the ceramic substrate 3 including the grooves 7.

Figure 11:
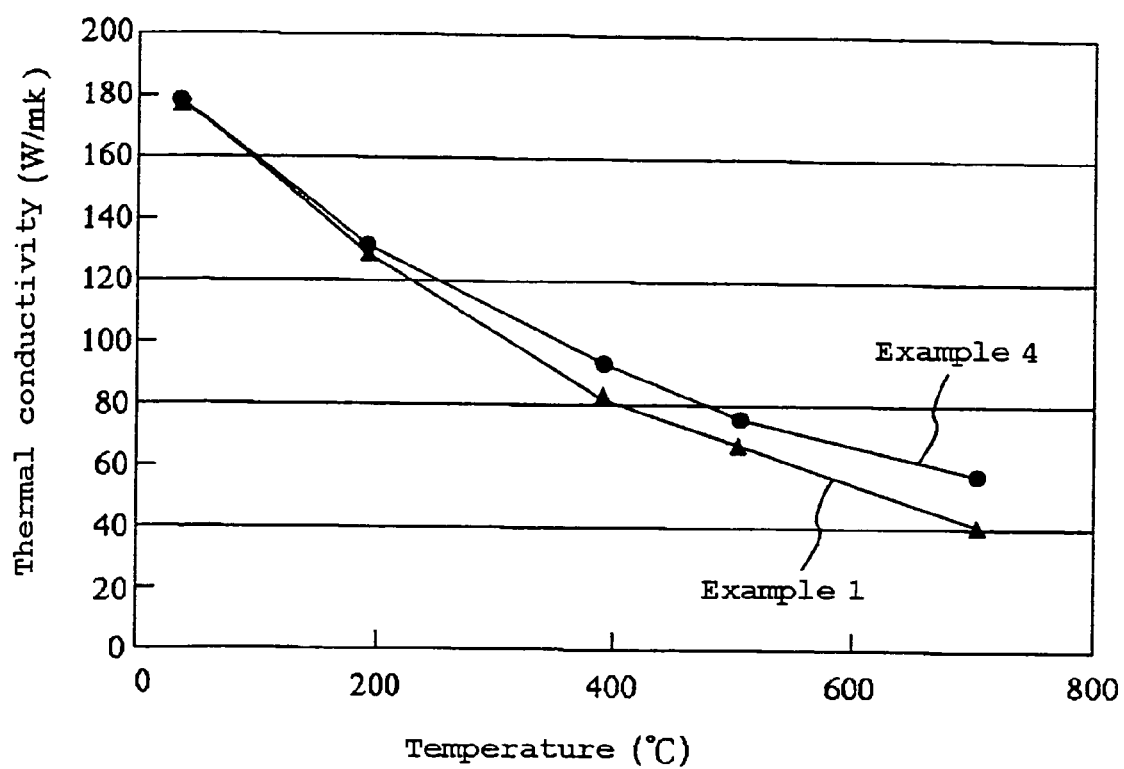
FIG. 11 is a graph showing relationship between the thermal conductivity and the temperature of the aluminum nitride sintered bodies according to Examples 1 and 4.

On the other hand, heating elements 41 as shown in FIG. 14, in the form of concentric circles as viewed from the above, are disposed on the bottom surface of the ceramic substrate 3 to control the temperature of the silicon wafer. External terminal pins 191 (reference to FIG. 8) are connected and fixed to both ends of the heating element 41. Inside the ceramic substrate 3, guard electrodes 5 and ground electrodes 6, in the form of a lattice as shown in FIG. 11, are formed to remove stray capacitors or noises.

After a silicon wafer, on which integrated circuits are formed, is put on the wafer prober having such a structure, a probe card having a tester pin is pressed against this silicon wafer. Then, a voltage is applied thereto while the silicone wafer is heated or cooled, so that a continuity test can be performed.

The following will describe one example of a process for producing the ceramic substrate for a semiconductor device of the third aspect of the present invention.

(1) First, amorphous carbon is produced. For example, a hydrocarbon consisting only of C, H and O, preferably a saccharide (sucrose or cellulose) is fired at a temperature of 300 to 500° C. in air, so as to produce pure amorphous carbon.

(2) Next, the above-mentioned carbon is mixed with aluminum nitride powder, which will be a matrix component. About the size of the mixed powder, the average particle diameter thereof is preferably as small as about 0.1 to 5 μm. This is because the sinterability thereof is improved as the size thereof is finer. The added amount of the carbon is decided under consideration of the lost amount at the time of firing.

In the case that an aluminum nitride substrate and the like is produced, a sintering aid, such as yttrium oxide (yttria: $Y_2O_3$), may be added to the above-mentioned mixture.

Instead of the above-mentioned steps (1), (2), it is allowable to adopt the following steps: ceramic powder, a binder, a saccharide and a solvent are mixed to produce green sheets; the green sheets are laminated; and the lamination of the green sheets is pre-fired at a temperature of 300 to 500° C. to make the saccharide into amorphous carbon. In this case, both of the saccharide and amorphous carbon may be added. As the solvent, α-terpineol, glycol and the like may be used.

(3) Next, a formed body obtained by putting the resultant powder mixture into a mold, or a lamination of the green sheets (each of which is pre-fired) is heated and pressed at a temperature of 1700 to 1900° C. and at a pressure of 80 to 200 kg/cm² in the atmosphere or an inert gas such as argon or nitrogen, so as to be sintered.

The ceramic substrate for a semiconductor device of the third aspect of the present invention can be basically produced by firing the formed body comprising the ceramic powder mixture or the green sheet lamination. At the time of putting the ceramic powder mixture into the mold: by embedding a metal plate (foil) a metal wire and the like, which will be heating elements, in the powder mixture; or by forming a conductor containing paste layer, which will be heating elements, on one green sheet out of the laminated green sheets, a ceramic substrate having therein the resistance heating elements can be produced.

After producing a sintered body, by: forming a conductor containing paste layer on the surface (bottom surface) thereof; and firing the product, heating elements can be formed on the bottom surface.

Furthermore, by: embedding metal plates (foils) and the like in the formed body; or forming a conductor containing paste layer on the green sheet, so as to have shapes of heating elements or electrodes such as electrostatic chucks, at the time of producing the ceramic substrate, a hot plate, an electrostatic chuck, a wafer prober, a susceptor and the like can be produced.

The conductor containing paste for producing the various electrodes or heating elements is not particularly limited, but the same conductor containing paste as used in the first aspect of the present invention can be used.

The ceramic substrate for a semiconductor device of the third aspect of the present invention can be used at a temperature of 200° C. or higher.

The following will describe the ceramic substrate for a semiconductor device of the fourth aspect of the present invention.

The ceramic substrate for a semiconductor device of the fourth aspect of the present invention is a ceramic substrate for a semiconductor-producing/examining device,
wherein a ceramic substrate: comprising both of:
carbon whose peak cannot be detected on its X-ray diffraction chart or whose peak is below its detection limit thereon; and
carbon whose peak can be detected thereon;
for example, a ceramic substrate using the aluminum nitride sintered body of the second aspect of the present invention and the like, is provided with a conductor.

Regarding a ceramic substrate comprising carbon whose peak is detected at positions where the diffraction angle 2θ is 10 to 90°, particularly 2θ is 44 to 45° on its X-ray diffraction chart, its volume resistivity at a high temperature of 200° C. or higher is largely lowered, therefore a leakage current or a short circuit may be caused between heating element patterns or between electrode patterns when the ceramic substrate is heated. In order to prevent such a short circuit and increase the electric resistivity of the carbon-containing sintered body at high temperature, there should be used: carbon whose crystallinity is lowered to such a degree that no peak is detected on its X-ray diffraction chart; or carbon forming solid-solution in the crystal phase: that is, carbon whose peak is not detected on the X-ray diffraction chart, as described above.

However, if carbon whose crystallinity is lowered to such a degree that no peak can be detected on the X-ray diffraction chart is added to the ceramic substrate, a problem that thermal conductivity of the ceramic substrate at high temperature drops may be caused. This would be because amorphous carbon is interposed in the interface between grains to become a barrier which blocks the conduction of heat.

Thus, as described above, in the case that the inventors add amorphous carbon therein, the invertors make the amorphous carbon and, crystalline carbon: having a crystal structure similar to metal crystal; and having a thermal conductivity which is not easily lowered at high temperature, to coexist.

If two kinds of the carbon are caused to coexist in this way, the volume resistivity at high temperature can be made to at least $10^8$ Ω·cm or more, and the thermal conductivity at high temperature can be made to 60 W/m·k or more, thereby overcoming the problem of the drop in the thermal conductivity which occurs when amorphous carbon alone is added.

In the fourth aspect of the present invention, a specific method for obtaining carbon whose peak cannot be detected on the X-ray diffraction chart or whose peak is below its detection limit thereon, the carbon being comprised in the ceramic substrate, may be, for example, the same method as in the third aspect of the present invention.

As the crystalline carbon, ordinary graphite or carbon black may be used.

The blend ratio of carbon whose peak cannot be detected on its X-ray diffraction chart or whose peak is below its detection limit thereon to carbon whose peak can be detected thereon (crystalline carbon) is adjusted within the range of, preferably from 1/200 to 200/1, more preferably from 1/100 to 100/1 (in weight ratio) if possible.

The ratio of two kinds of the carbon is measured by laser Raman spectroscopy. In the laser Raman spectroscopy, the peak of crystalline carbon (Raman shift: 1580 cm$^{-1}$) and the peak of amorphous carbon (Raman shift: 1355 cm$^{-1}$) show their appearances separately. Therefore, the blend ratio can be understood from the ratio between the heights of the two peaks.

In another way, crystalline carbon having a known concentration is added to the ceramic, to perform X-ray diffraction analysis. Thus, relationship between each concentration of the carbon and the height (more precisely, the area) of the peak thereof is obtained as a calibration curve. On the other hand, the amount of all of two kinds of the carbon is calculated by measuring concentration of $CO_x$ gas, such as CO and $CO_2$, generated by firing all carbons in a sample to be measured at a temperature of 500 to 800° C. Also, the sample to be measured is subjected to X-ray diffraction analysis, so that the amount of carbon which can be detected by the X-ray diffraction analysis is specified from the obtained height (more precisely, the area) of the peak. Thus, a difference between the amount of all of the carbons and the amount of carbon which can be detected by the X-ray diffraction analysis can be defined as carbon which cannot be detected by the X-ray diffraction analysis.

The total amount of the added amounts of the two kinds of carbon is desirably set to 200 to 5000 ppm, and is more desirably set to 200 to 2000 ppm. If the total amount is below 200 ppm, it cannot be said that the resultant aluminum nitride sintered body is black, and the sintered body has a brightness over N4. On the other hand, if the total amount is over 5000 ppm, the sinterability of the ceramic becomes poor.

The ceramic material constituting the ceramic substrate for a semiconductor device of the fourth aspect of the present invention may be the same used in the third aspect of the present invention.

In the ceramic substrate for a semiconductor device of the fourth aspect of the present invention, the sintered body constituting the matrix desirably comprises a sintering aid. The sintering aid may be the same as in the ceramic substrate for a semiconductor device of the third aspect of the present invention, and the like. The content in the sintering aid is desirably 0.1 to 10% by weight.

Regarding the ceramic substrate for a semiconductor device of the fourth aspect of the present invention desirably, its brightness defined in JIS Z 8721 is N4 or less in the same way as in the ceramic substrate for a semiconductor device of the third aspect of the present invention.

Similarly to the ceramic substrate for a semiconductor device of the third aspect of the present invention, the ceramic substrate for a semiconductor device of the fourth aspect of the present invention is a ceramic substrate used in a device for producing or examining a semiconductor. Specific examples of the device include an electrostatic chuck, a wafer prober, a hot plate and a susceptor and the like.

Similarly to the ceramic substrate for a semiconductor device of the third aspect of the present invention, the ceramic substrate for a semiconductor device of the fourth aspect of the present invention functions as an electrostatic chuck, a ceramic neater, a wafer prober and the like by providing the ceramic substrate with a conductor comprising a conductive metal or a conductive ceramic.

The ceramic substrate for a semiconductor device of the fourth aspect of the present invention can be produced by using, for example, the following method and the like. That is, in the process for producing the ceramic substrate for a semiconductor device of the third aspect of the present invention, at the time of mixing carbon with ceramic powder [the step (2) in the above example of the process for producing the ceramic substrate for a semiconductor device of the third aspect of the present invention], crystalline carbon, such as graphite or carbon black, together with amorphous carbon is added, and further, other steps are performed in the same way as in the process for producing the ceramic substrate for a semiconductor device of the third aspect of the present invention. As a result, the ceramic substrate can be produced.

BEST MODES FOR CARRYING OUT THE INVENTION

EXAMPLE 1

AlN+$Y_2O_3$+Amorphous Carbon (1) Sucrose was heated at a temperature of 500° C. in the current of an oxidizing gas (in the air) to decompose the sucrose thermally. In this way, amorphous carbon was obtained.
(2) 100 parts by weight of aluminum nitride powder (made by Tokuyama Corp., average particle diameter: 1.1 $\mu$m), 4 parts by weight of yttrium oxide ($Y_2O_3$: yttria, average particle diameter: 0.4 $\mu$m), and 0.09 part by weight of amorphous carbon which was obtained in the step (1) were mixed, and the mixture was put into a mold and was hot-pressed at a temperature of 1890° C. and at a pressure of 150 kg/cm² in the atmosphere of nitrogen for 3 hours to obtain an aluminum nitride sintered body.

The amount of carbon in the sintered body was measured by pulverizing the sintered body and heating the pulverized product at a temperature of 800° C. and then collecting the generated $CO_2$ gas. The result of the measurement by this method demonstrated that the amount of carbon comprised in the aluminum nitride sintered body was 800 ppm. The brightness N thereof was 3.5.

EXAMPLE 2

AlN+Amorphous Carbon (1) Sucrose was heated at a temperature of 500° C. in air to decompose the sucrose thermally. In this way, amorphous carbon was obtained.
(2) 100 parts by weight of aluminum nitride-powder (made by Tokuyama Corp., average particle diameter: 1.1 $\mu$m), and 0.09 part by weight of amorphous carbon which was obtained in the step (1) were mixed, and the mixture was put into a mold and was hot-pressed at a temperature of 1890° C. and at a pressure of 150 kg/cm² in the atmosphere of nitrogen for 3 hours to obtain an aluminum nitride sintered body. The amount of carbon comprised in the resultant aluminum nitride sintered body was 805 ppm. The brightness N thereof was 3.5.

EXAMPLE 3

Forming Solid Solution of Carbon 100 parts by weight of aluminum nitride powder (made by Tokuyama Corp., average particle diameter: 1.1 $\mu$m), 4 parts by weight of yttrium oxide ($Y_2O_3$: yttria, average particle diameter: 0.4 $\mu$m), and 0.09 part by weight of graphite (GR-1200, made by Toyo Tanso Co., Ltd.) were mixed, and the mixture was put into a mold and was hot-pressed at a temperature of 1890° C. and at a pressure of 150 kg/cm² in the atmosphere of nitrogen for 3 hours. Furthermore, this sintered body was heated at a temperature of 1850° C. and at a normal pressure in the atmosphere of nitrogen for 3 hours to form solid-solution of graphite in the aluminum nitride phase. The amount of carbon comprised in the resultant aluminum nitride sintered body was 810 ppm. The brightness N thereof was 4.0. It can be considered that the phenomenon of formation of solid-solution of carbon was not generated during the hot press.

COMPARATIVE EXAMPLE 1

AlN+$Y_2O_3$ 100 parts by weight of aluminum nitride powder (made by Tokuyama Corp., average particle diameter: 1.1 $\mu$m), and 4 parts by weight of yttrium oxide ($Y_2O_3$: yttria, average particle diameter: 0.4 $\mu$m) were mixed, and the mixture was put into a mold and was hot-pressed at a temperature of 1890° C. and a pressure of 150 kg/cm² in the atmosphere of nitrogen for 3 hours, to obtain an aluminum nitride sintered body. The amount of carbon comprised in the resultant aluminum nitride sintered body was 100 ppm or less. The brightness N thereof was 7.0.

COMPARATIVE EXAMPLE 2

AlN+Amorphous Carbon

In this Comparative Example, phenol resin powder was utilized as a binder in accordance with JP Kokai Hei 9-48668. It can be considered that carbon obtained by decomposing the phenol resin and the acrylic binder; was crystalline in this prior art.

First, 100 parts by weight of aluminum nitride powder (made by Tokuyama Corp., average particle diameter: 1.1 $\mu$m), and 5 parts by weight of the phenol resin powder were mixed, and the mixture was put into a mold and was hot-pressed at a temperature of 1890° C. and a pressure of 150 kg/cm² in the atmosphere of nitrogen for 3 hours, to obtain an aluminum nitride sintered body. The amount of carbon comprised in the resultant aluminum nitride sintered body was 810 ppm. The brightness N thereof was 4.0.

FIG. 1 shows transition in the volume resistivities from room temperature to 500° C. on Examples 1 to 3 and Comparative Examples 1, 2.

As shown in FIG. 1, in the example of the sintered body comprising only crystalline carbon, indicated as Comparative Example 2, its volume resistivity at a temperature of 500° C. was about 1/10 of those of the Examples.

In the above-mentioned measurement, the volume resistivity and the thermal conductivity were measured as follows.

(1) Volume resistivity: A sintered body was cut into a piece having a diameter of 10 mm and a thickness of 3 mm. Three terminals (a main electrode, an opposite electrode, and a guard electrode) were formed, and then a DC voltage was applied thereto to charge the sintered body for one minute. Thereafter, the electric current (I) flowing through a digital electrometer was read to obtain the resistance (R) of the sample. The volume resistivity ($\rho$) was calculated in accordance with the following calculating equation (1) from the resistance (R) and the size of the sample:

$$\rho = \epsilon/t \times R = S/t \times V/I \quad (1)$$

wherein t is the thickness of the sample and S is given by the following calculating equations (2) and (3).

$$D_0 = 2r_0 = (D_1 + D_2)/2 = 1.525 \text{ cm} \quad (2)$$

$$S = \pi D_0^2/4 = 1.83 \text{ cm}^2 \quad (3)$$

In the calculating equations (2) and (3), $r_1$ is the radius of the main electrode, $r_2$ is the inner size (radius) of the guard electrode, $r_3$ is the outer size (radius) of the guard electrode, $D_1$ is the diameter of the main electrode, $D_2$ is the inner size (diameter) of the guard electrode, $D_3$ is the outer size (diameter) of the guard electrode. In the present Examples, $2r_1 = D_1 = 1.45$ cm, $2r_2 = D_2 = 1.60$ cm, and $2r_3 = D_3 = 2.00$ cm.

Figure 2:
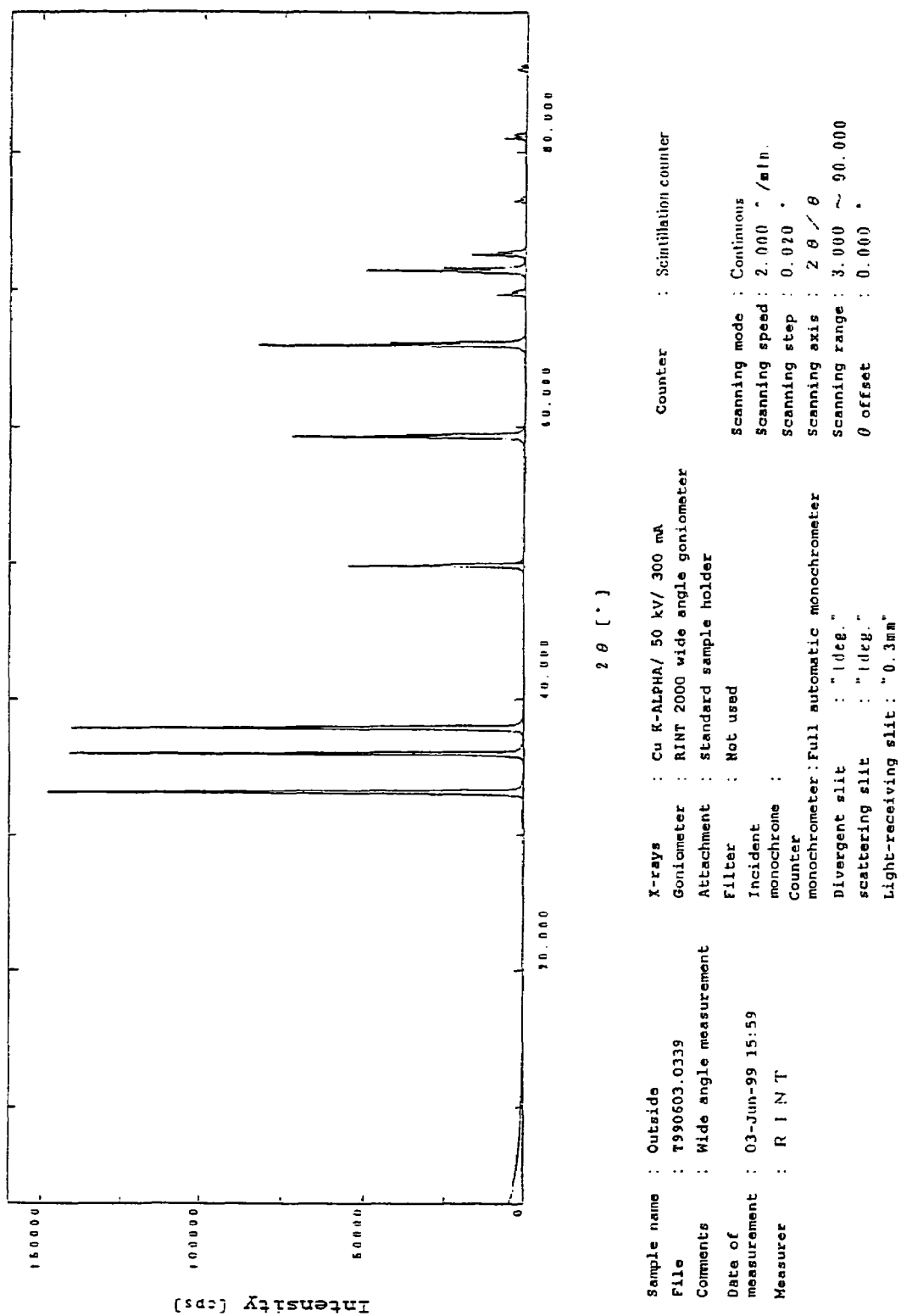
FIG. 2 is an X-ray diffraction chart of the aluminum nitride sintered body of Example 1.
Figure 3:
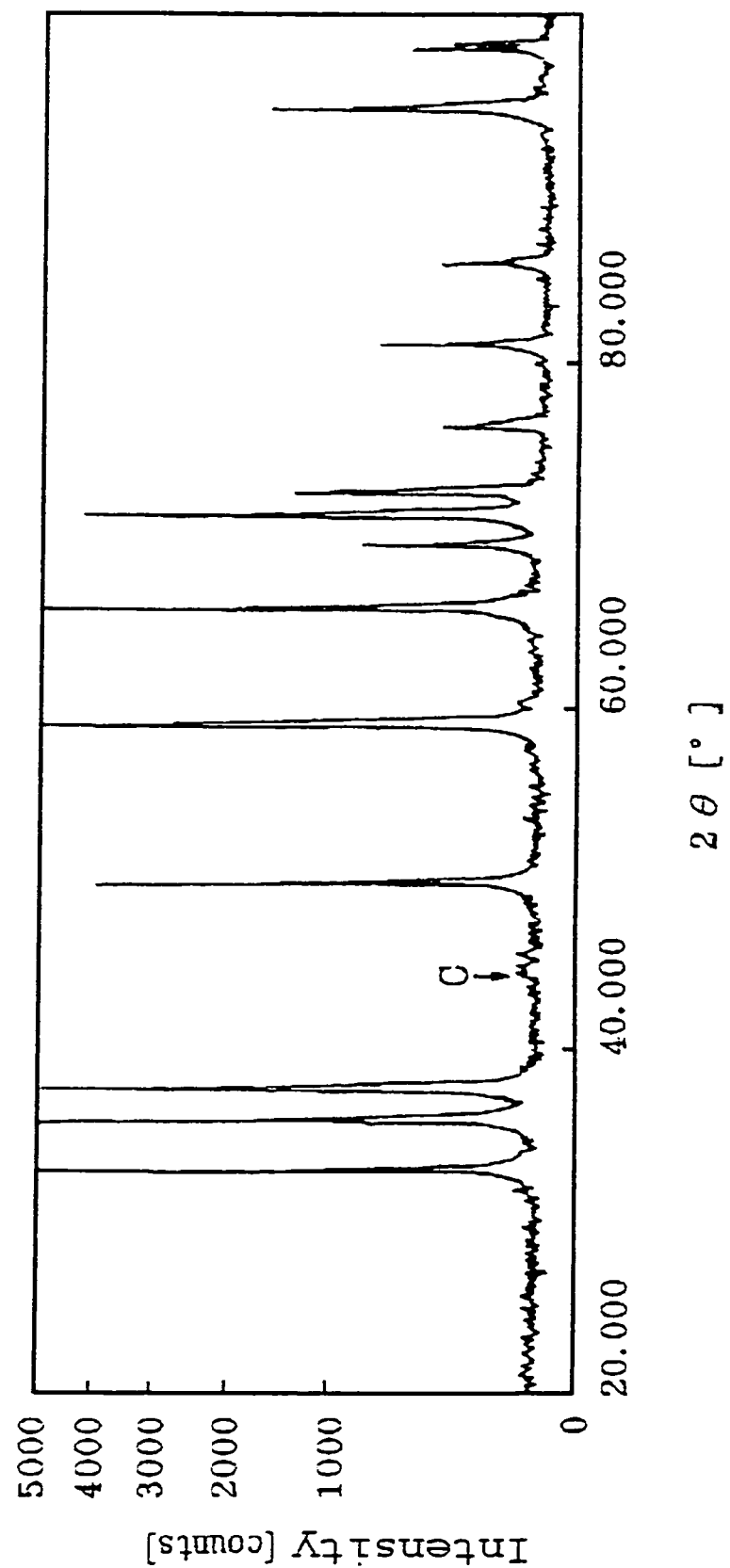
FIG. 3 is an X-ray diffraction chart of the aluminum nitride sintered body of Comparative Example 2.

FIGS. 2, 3 show X-ray diffraction charts of the sintered bodies, and show the chart of Example 1 (reference to FIG. 2) and the chart of Comparative Example 2 (reference to FIG. 3). As shown in these figures, in Example 1, no peak was able to be detected at positions where the diffraction angle 2θ was 10 to 90° and no halo showed its appearance at positions where 2θ was 15 to 40°. However, in Comparative Example 2, a peak was observed at a position where 2θ was 44 to 45°.

Figure 9:
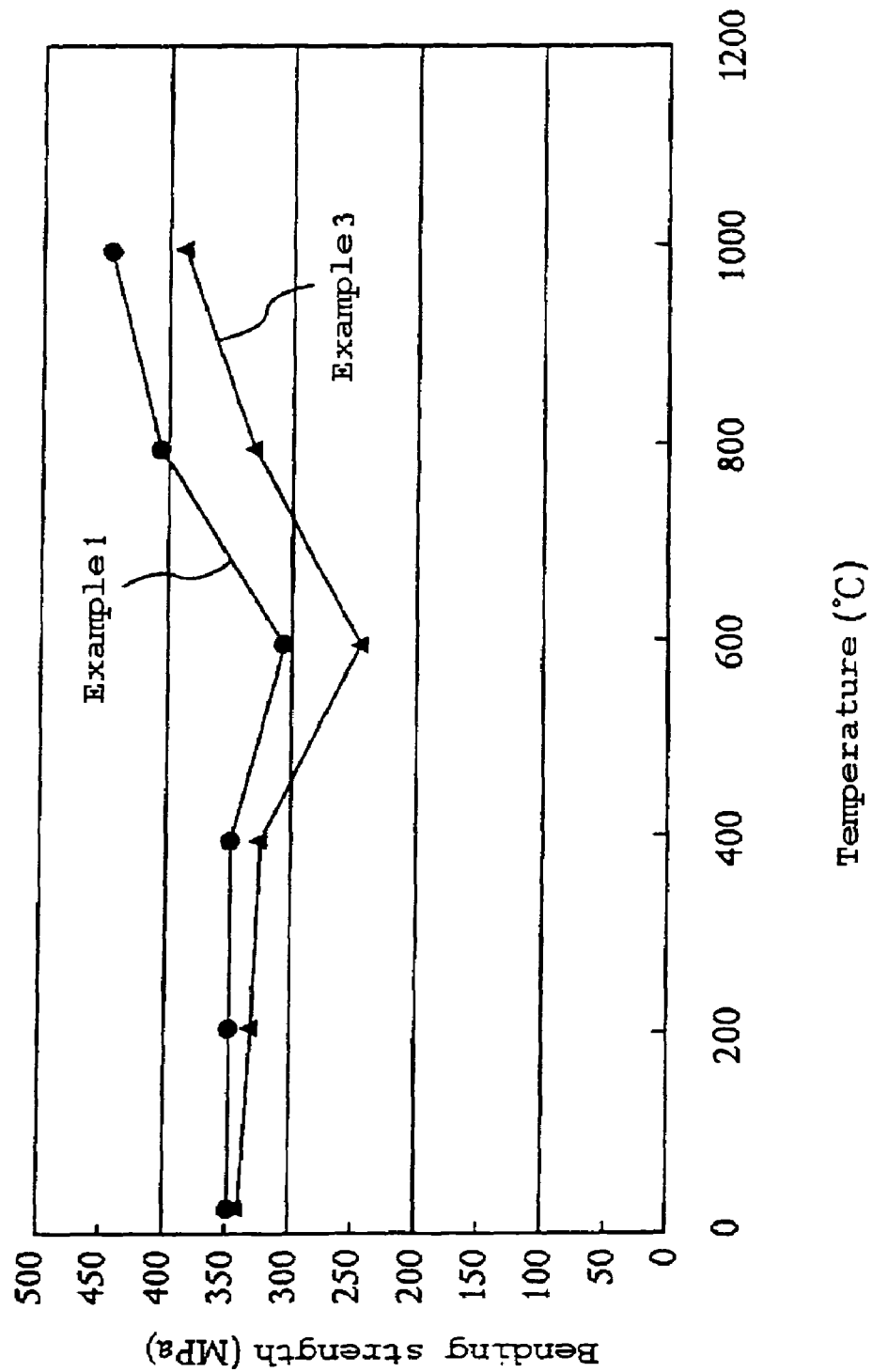
FIG. 9 is a graph showing the dependency of the bending strength of the aluminum nitride sintered bodies in Examples 1 and 3 upon temperature.

FIG. 9 shows results of strength measurement of the sintered bodies of Examples 1, 3. As shown in FIG. 9, in the aluminum nitride sintered body in which carbon is forming solid-solution (Example 3), its strength is lowered.

The strength was measured in the atmosphere at a temperature of 25 to 1000° C., using an Instron universal testing machine (4507 type, load cell: 500 kgf), under the following conditions: cross head speed=0.5 mm/minute, span length L=30 mm, thickness of the test piece=3.06 mm, and width of the test piece=4.03 mm. Using the following calculating equation (4), three-point bending strength σ (kgf/mm 2) was calculated:

$$\sigma = 3PL/2 \text{ wt}^2 \quad (4)$$

In the calculating equation (4), P is the maximum load (kgf) when the test piece was broken, L is the distance (30 mm) between lower fulcra, t is the thickness (mm) of the test piece, and w is the width (mm) of the test piece.

The sintered bodies of Examples 1 to 3 and Comparative Examples 1, 2 were heated up to 500° C. on a hot plate, their surface temperatures were measured with a thermoviewer (made by Japan Datum Inc., IR162012-0012) and a K type thermocouple according to JIS C 1602 (1980) to examine temperature difference between the two measured values. It can be said that as a gap between the temperature measured with the thermocouple and that measured with the thermoviewer is larger, the temperature error with the thermoviewer is larger.

Results of the measurement are as follows: a temperature difference was 0.8° C. in Example 1; a temperature difference was 0.9° C. in Example 2; a temperature difference was 1.0° C. in Example 3; a temperature difference was 8° C. in Comparative Example 1; and a temperature difference was 0.8° C. in Comparative Example 2.

EXAMPLE 4

AlN+Y$_2$O$_3$+Amorphous Carbon+Graphite (1) Sucrose was heated at a temperature of 500° C. in the current of an oxidizing gas (in the air) to decompose the sucrose thermally. In this way, amorphous carbon was obtained.

(2) 100 parts by weight of aluminum nitride powder (made by Tokuyama Corp., average particle diameter: 1.1 μm), 4 parts by weigh tot yttrium oxide (Y$_2$O$_3$: yttria, average particle diameter: 0.4 μm), 0.04 part by weight of amorphous carbon which was obtained in the step (1) and 0.05 part by weight of crystalline graphite powder (GR-1200, made by Toyo Tanso Co., Ltd.) were mixed, and the mixture was put into a mold and was hot-pressed at a temperature of 1890° C. and a pressure of 150 kg/cm² in the atmosphere of nitrogen for 3 hours to obtain an aluminum nitride sintered body.

The total amount of carbon comprised in the resultant aluminum nitride sintered body was 800 ppm. The brightness N thereof was 3.5.

EXAMPLE 5

AlN+Amorphous Carbon+Graphite (1) Sucrose was heated at a temperature of 500° C. in air to decompose the sucrose thermally. In this way, amorphous carbon was obtained.

(2) 100 parts by weight of aluminum nitride powder (made by Tokuyama Corp., average particle diameter: 1.1 μm), 0.06 part by weight of amorphous carbon which was obtained in the step (1) and 0.63 part by weight of crystalline graphite powder (GR-1200, made by Toyo Tanso Co., Ltd.) were mixed, and the mixture was put into a mold and was hot-pressed at a temperature of 1890° C. and a pressure of 150 kg/cm² in the atmosphere of nitrogen for 3 hours to obtain an aluminum nitride sintered body. The total amount of carbon comprised in the resultant aluminum nitride sintered body was 810 ppm. The brightness N thereof was 3.5.

EXAMPLE 6

Forming Solid-solution of Carbon

The sintered body of Example 4 was heated at a temperature of 1850° C. and at an ordinary pressure in the atmosphere of nitrogen for 1 hour so that a part of carbon forms solid-solution in the aluminum nitride phase.

It cannot be considered that carbon forms solid-solution during the hot press.

Figure 13:
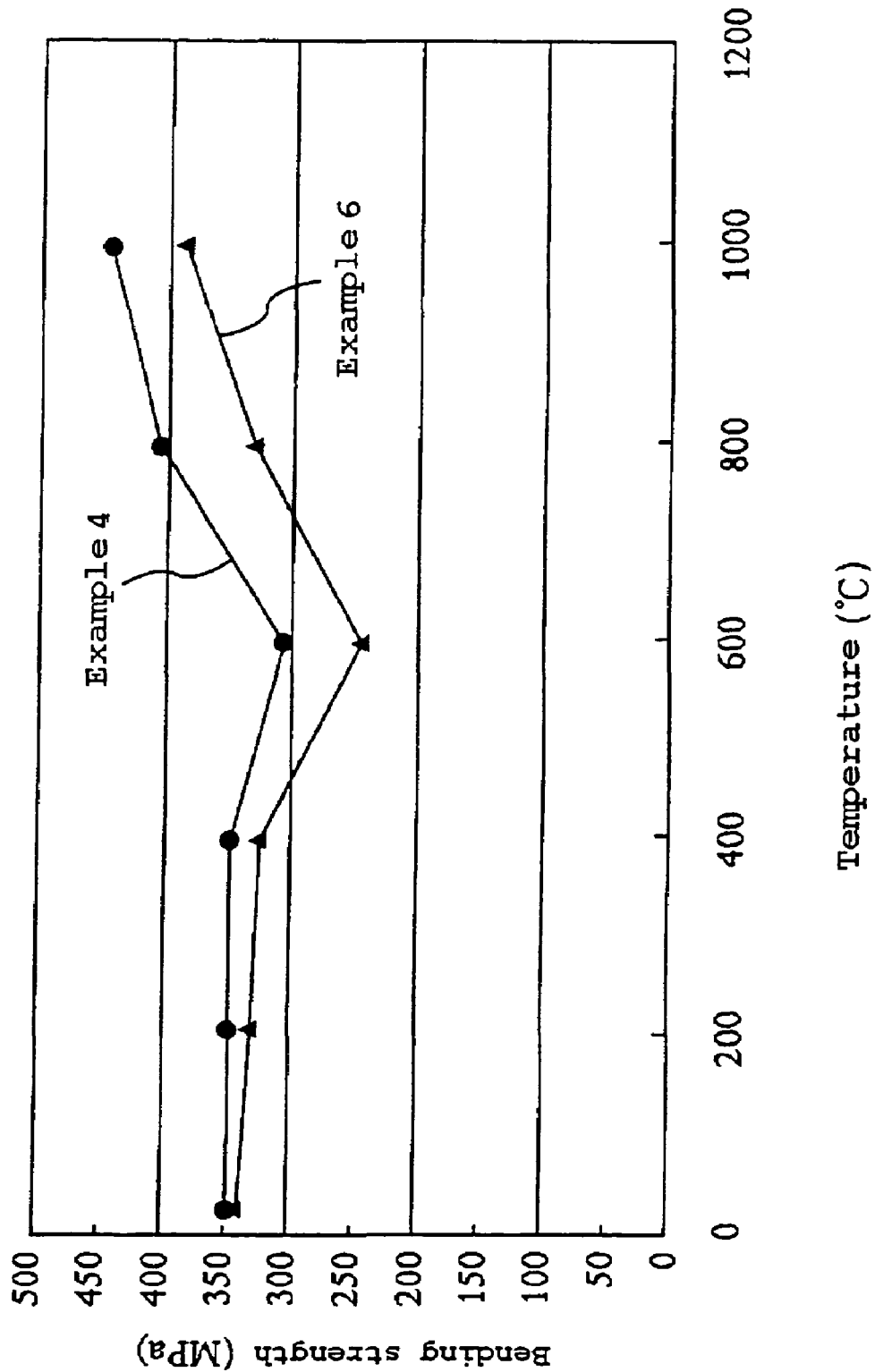
FIG. 13 is a graph showing the dependency of the bending strength of the aluminum nitride sintered bodies in Examples 4 and 6 upon temperature.

FIG. 13 shows results of strength measurement of the sintered bodies of Examples 4, 6. As shown in FIG. 13, about the aluminum nitride sintered body wherein a part of carbon formed solid-solution in the crystal phase (Example 6), its strength was lowered. Therefore, it can be considered that use of amorphous carbon was more profitable than the use of solid-solution.

Figure 10:
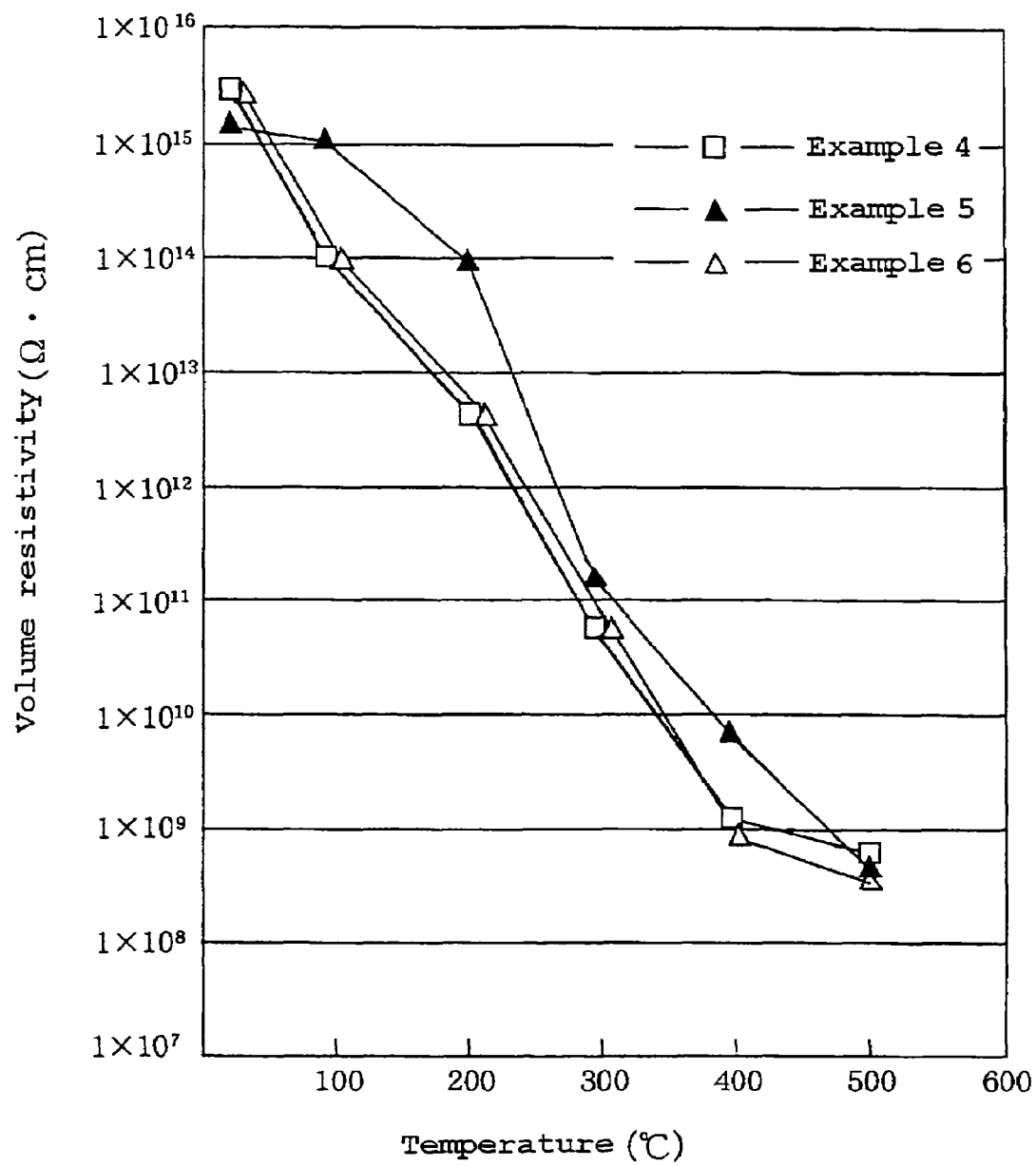
FIG. 10 is a graph showing relationship between the volume resistivity and the temperature of aluminum nitride sintered bodies according to Examples 4 to 6.

FIG. 10 shows change in the volume resistivities from room temperature to 500° C. on the aluminum nitride sintered bodies of Examples 3 to 6. As shown in FIG. 10, in the aluminum nitride sintered bodies of Examples 4 to 6, a high volume resistivity over $10^8$ Ω·cm was kept even at a high temperature (500° C.).

FIG. 11 shows the dependency of the thermal conductivities of the sintered bodies upon temperature. In the aluminum nitride sintered body of Example 1, which comprised only amorphous carbon, the degree of a drop thereof in its thermal conductivity was large. On the other hand, in the aluminum nitride sintered body of Example 4, which comprised both of amorphous carbon and crystalline carbon, a high thermal conductivity was kept even at a high temperature (500° C.).

Figure 12:
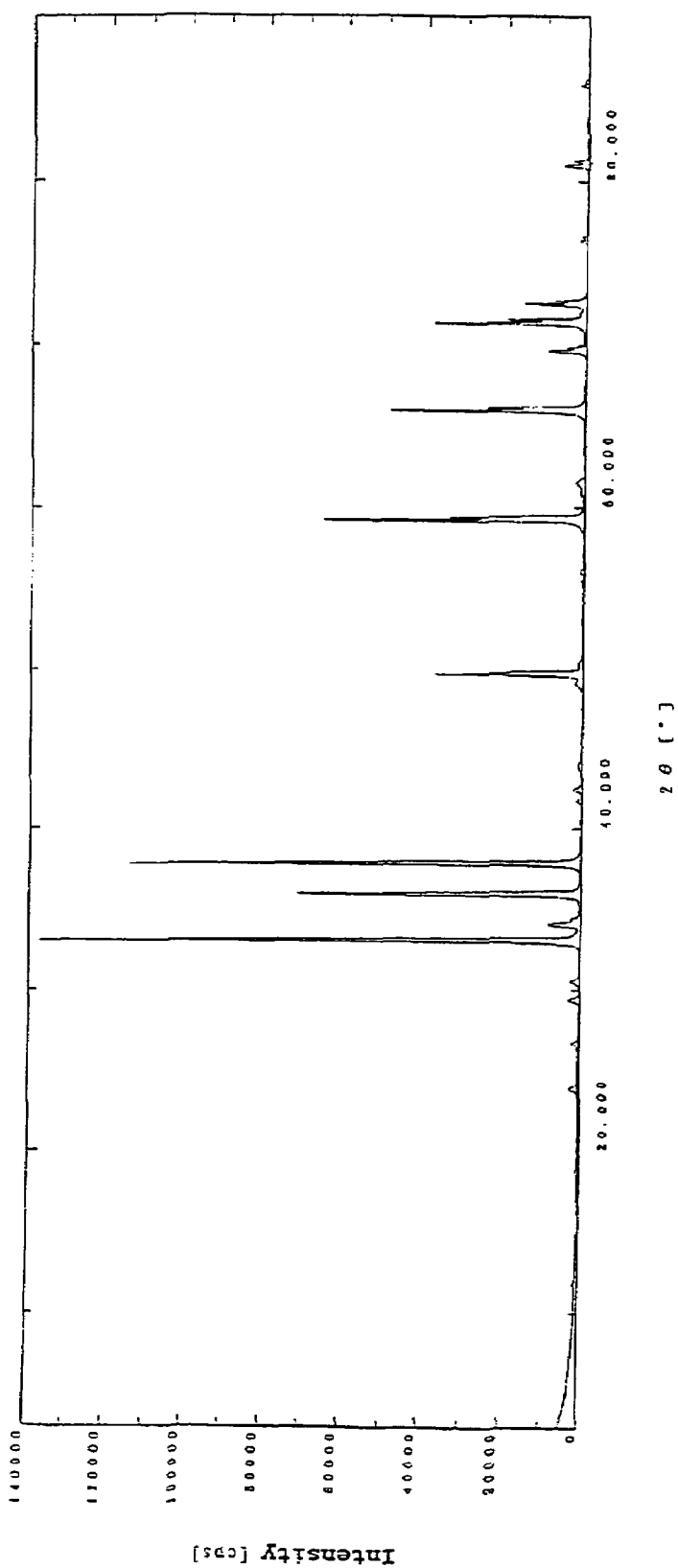
FIG. 12 is an X-ray diffraction chart of the aluminum nitride sintered body of Example 4.

FIG. 12 is an X-ray diffraction chart of the sintered body of Example 1. Since crystalline carbon was used in Example 4 (reference to FIG. 12), a peak originating from crystalline carbon can be observed.

In the above-mentioned measurement, thermal conductivity was measured as follows.

(2) Thermal Conductivity:

a. Used Machine

Rigaku laser flash method thermal constant measuring machine

LF/TCM-FA8510B b. Test Conditions

Temperature: ambient temperature, 200° C., 400° C., 500° C., and 700° C.

Atmosphere: vacuum c. Measuring Method

Temperature in specific heat measurement was detected with a thermocouple (Platinel) bonded to the back surface of the sample with silver paste.

Specific heat at ambient temperature was measured in the state that a light receiving plate (glassy carbon) was bonded to the upper surface of the sample through silicone grease. The specific heat (Cp) of the sample was obtained from the following calculating equation (5):

$$Cp = \{\Delta Q/\Delta T - Cp_{G.C} \times W_{G.C} - CP_{S.G} \times W_{S.G}\}(1/W) \quad (5)$$

In the calculating equation (5), $\Delta O$ is an input energy, $\Delta T$ is the saturated value of rising temperature of the sample, $CP_{G.C}$ is the specific heat of the glassy carbon, $W_{G.C}$ is the weight of the glassy carbon, $Cp_{S.G}$ is the specific heat of the silicone grease, $W_{S.G}$ is the weight of the silicone grease, and W is the weight of the sample.

The sintered bodies of Examples 4 to 6 were heated up to 500° C. on a hot plate. Their surface temperatures were measured with a thermoviewer (made by Japan Datum Inc., IR162012-0012) and a K type thermocouple according to JIS C 1602 (1980) to examine temperature difference between the two measured values. Results of the measurement are as follows: a temperature difference was 0.8° C. in Example 4; a temperature difference was 0.9° C. in Example 5; and a temperature difference was 1.0° C. in Example 6.

EXAMPLE 7

Ceramic Heater (AlN+Y$_2$O$_3$+Amorphous Carbon)

(1) An aluminum nitride sintered body was obtained in the same way as in Example 1.

(2) A conductor containing paste was printed on the bottom surface of the sintered body obtained in the step (1) by screen-printing. The pattern of the printing was made to a concentric circular pattern as illustrated in FIG. 14.

The used conductor containing paste was Solvest PS603D made by Tokuriki Kagaku Kenkyu-zyo, which is used to form plated through holes in printed circuit boards.

This conductor containing paste was a silver-lead paste and contained 7.5 parts by weight of metal oxides comprising lead oxide (5% by weight), zinc oxide (55% by weight), silica (10% by weight), boron oxide (25% by weight) and alumina (5% by weight) per 100 parts by weight of silver. The silver particles had an average particle diameter of 4.5 μm, and were scaly.

(3) Next, the sintered body on which the conductor containing paste was printed was heated and fired at a temperature of 780° C. to sinter silver and lead in the conductor containing paste and bake them onto the sintered body. Thus, heating elements 92 were formed. The silver-lead heating elements 92 had a thickness of 5 μm, a width of 2.4 mm and a area resistivity of 7.7 mΩ/□

(4) The sintered body made in the step (3) was immersed into an electroless nickel plating bath comprising an aqueous solution containing 80 g/L of nickel sulfate, 24 g/L of sodium hypophosphite, 12 g/L of sodium acetate, 8 g/L of boric acid, and 6 g/L of ammonium chloride to precipitate a metal covering layer (nickel layer) 92a having a thickness of 1 μm on the surface of the silver-lead heating elements 92.

(5) By screen printing, a silver-lead solder paste (made by Tanaka Kikinzoku Kogyo CO.) was printed on portions to which external terminal pins for attaining connection to a power source would be attached, to form a solder layer.

Next, terminal pins 93 made of koval were put on the solder layer and the solder layer were heated and reflowed at a temperature of 420° C. to attach the terminal pins 93 onto the surface of the heating elements 92.

(6) Thermocouples for controlling temperature were inserted into the bottomed holes. A polyimide resin was filled into the holes and was cured at a temperature of 190° C. for 2 hours, to obtain a ceramic heater 10 (reference to FIG. 15).

EXAMPLE 8

Ceramic Heater (AlN+Amorphous Carbon)

An aluminum nitride sintered body was obtained in the same way as in Example 2, and subsequently resistance heating elements 92 were disposed on the bottom surface of the sintered body in the same way as in the steps (2) to (6) in Example 7, so as to obtain a ceramic heater 10 (reference to FIG. 15).

EXAMPLE 9

Ceramic Heater (Forming Solid-solution of Carbon)

An aluminum nitride sintered body was obtained in the same way as in Example 3, and subsequently resistance heating elements 92 were disposed on the bottom surface of the sintered body in the same way as in the steps (2) to (6) in Example 7, so as to obtain a ceramic heater 10 (reference to FIG. 15).

COMPARATIVE EXAMPLE 3

Ceramic Heater (AlN+$Y_2O_3$)

An aluminum nitride sintered body was obtained in the same way as in Comparative Example 1, and subsequently resistance heating elements 92 were disposed on the bottom surface of the sintered body in the same way as in the steps (2) to (6) in Example 7, so as to obtain a ceramic heater 10 (reference to FIG. 15).

COMPARATIVE EXAMPLE 4

Ceramic Heater (AlN+Amorphous Carbon)

An aluminum nitride sintered body was obtained in the same way as in Comparative Example 2, and subsequently resistance heating elements 92 were disposed on the bottom surface of the sintered body in the same way as in the steps (2) to (6) in Example 7, so as to obtain a ceramic heater 10 (reference to FIG. 15).

The ceramic heaters obtained in Examples 7 to 9 exhibited a brightness N of 4 or less to give a large radiant heat amount. The ceramic heaters also had a sufficiently large volume resistivity in a high temperature range. Therefore, neither leakage current nor short circuit was generated.

On the other hand, the ceramic heater of Comparative Example 4, which comprised only crystalline carbon, had a low volume resistivity in a high temperature range. At about 500° C., a leakage current of 10 mA was generated in the resistance heating elements. Thus, the ceramic heater was not practical.

Electric current was applied to the ceramic substrate for a semiconductor device (ceramic heater) of Examples 7 to 9 and Comparative Examples 3, 4 to heat them up to 500° C., and their surface temperatures were measured with a thermoviewer (made by Japan Datum Inc., IR162012-0012) and a K type thermocouple according to JIS C 1602 (1980) to examine temperature difference between the two measured values. Results of the measurement are as follows: a temperature difference was 0.8° C. in Example 7; a temperature difference was 0.9° C. in Example 8; a temperature difference was 1.0° C. in Example 9; a temperature difference was 8° C. in Comparative Example 3; and a temperature difference was 0.8° C. in Comparative Example 4.

EXAMPLE 10

Figure 7:
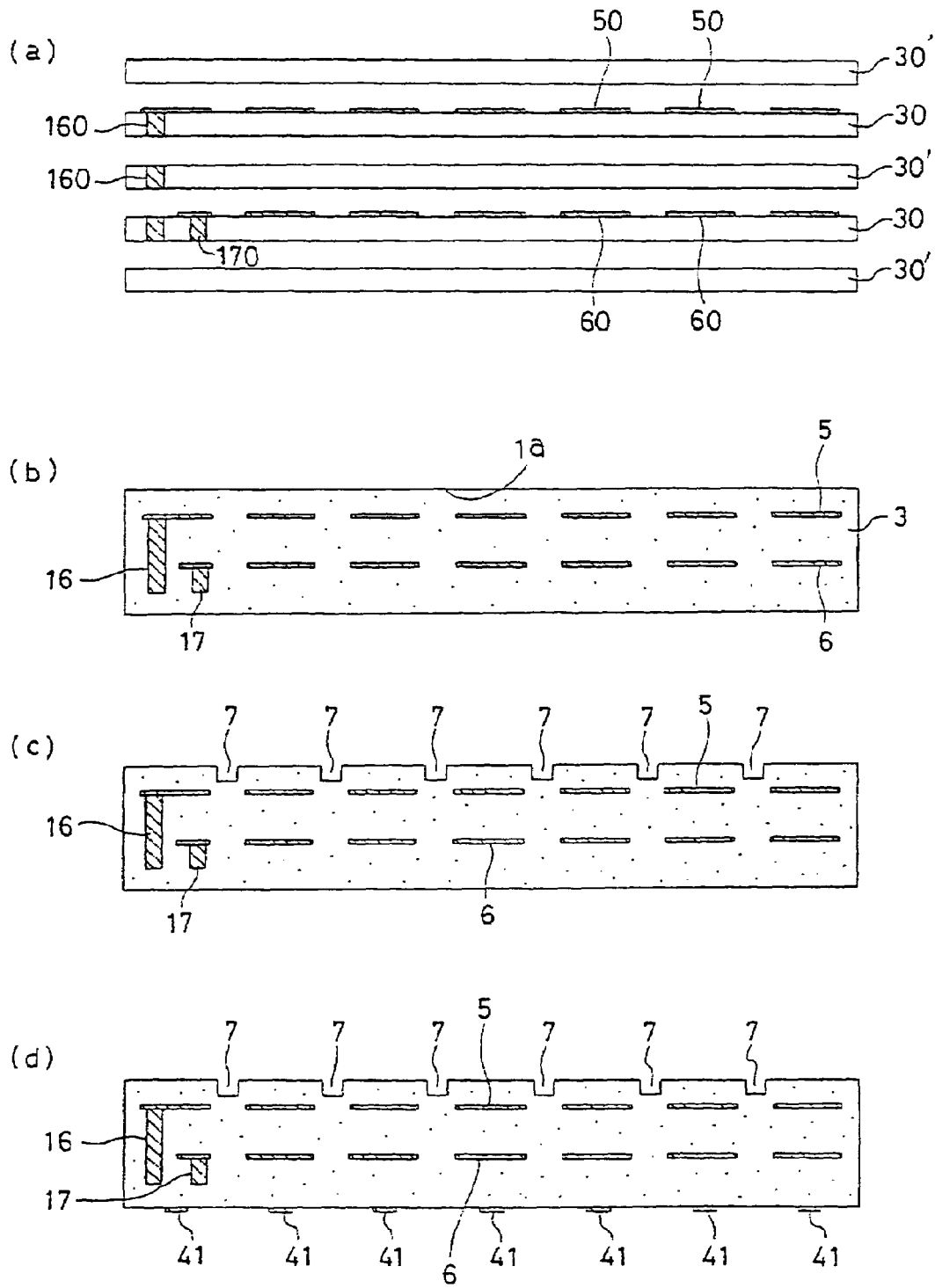
FIG. 7 is an explanatory view of a process for producing a wafer prober comprising an aluminum nitride sintered body.
Figure 8:
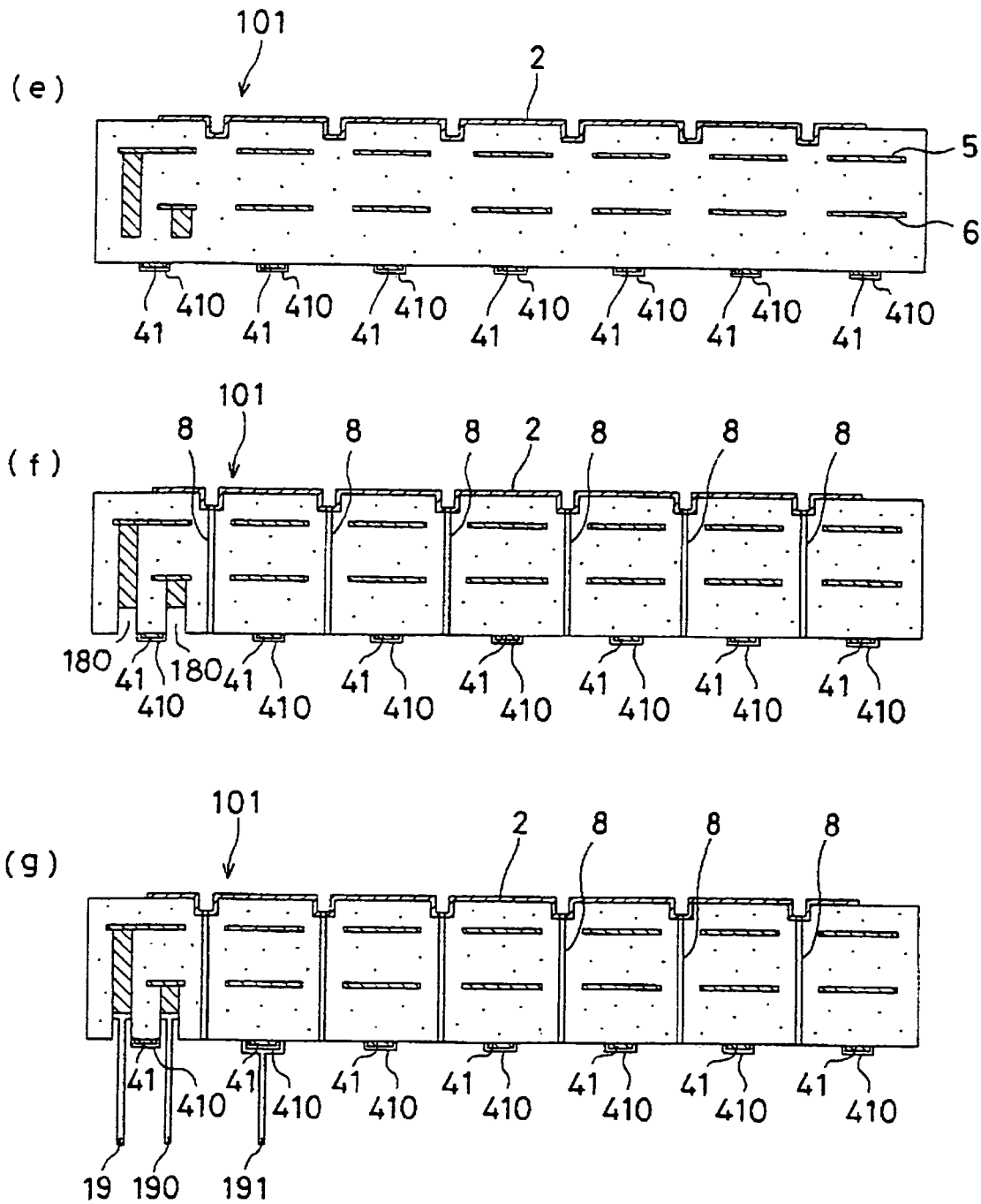
FIG. 8 is an explanatory view of the process for producing the wafer prober comprising the aluminum nitride sintered body.

Wafer Prober (Reference to FIGS. 7 and 8)

(1) A composition obtained by mixing the following was used and formed by the doctor blade method to obtain a green sheet 30 having a thickness of 0.47 mm: 100 parts by weight of aluminum nitride powder (made by Tokuyama Corp., average particle diameter: 1.1 $\mu$m), 4 parts by weight of yttria (average particle diameter: 0.4 $\mu$m), 0.2 part by weight of sucrose, and 53% by weight of alcohols comprising 1-butanol and ethanol.

(2) This green sheet 30 was dried at a temperature of 80° C. for 5 hours, and punched to make through holes for plated through holes, for connecting heating elements and external terminal pins.

(3) A conductor containing paste A was prepared by mixing 100 parts by weight of tungsten carbide particles having an average particle diameter of 1 $\mu$m, 3.0 parts by weight of an acrylic binder, 3.5 parts by weight of α-terpineol solvent, and 0.3 part by weight of a dispersant. A conductor containing paste B was also prepared by mixing 100 parts by weight of tungsten particles having an average particle diameter of 3 $\mu$m, 1.9 parts by weight of an acrylic binder, 3.7 parts by weight of α-terpineol solvent, and 0.2 part by weight of a dispersant.

(4) The conductor containing paste A was printed on the surface of the green sheet 30 by screen printing, so as to form a printed layer 50 for guard electrodes and a printed layer 60 for ground electrodes, in a lattice form.

The conductor containing paste B was filled into the through holes for plated through holes, for the connection to external terminals, to make filling layers 160, 170 for the plated through holes.

The green sheets 30 on which the conductor containing paste was printed and green sheets 30' on which no conductor containing paste was printed, the number of which was 50, were laminated and then the sheets were integrated with each other at a temperature of 130° C. and at a pressure of 80 kgf/$cm^2$ (reference to FIG. 7(a)).

(5) The lamination resulting from the integration was degreased at a temperature of 600° C. for 5 hours, and was then hot-pressed under conditions of 1890° C. and a pressure of 150 kg/$cm^2$ for 3 hours, to obtain an aluminum nitride plate having a thickness of 3 mm. This plate was cut off into a disk of 230 mm in diameter to prepare an aluminum nitride substrate 3 (reference to FIG. 7(b)). About the size of plated through holes 16 and 17, their diameter was 0.2 mm and their depth was 0.2 mm. The thickness of guard electrodes 5 and ground electrodes 6 was 10 $\mu$m. The positions where the guard electrodes 5 were formed were 1 mm apart from the heating elements along the direction of thickness of the sintered body. The position where the ground electrodes 6 was formed were 1.2 mm apart from a chuck face 1a along the direction of thickness of the sintered body.

(6) The aluminum nitride substrate 3 obtained in the step (5) was ground with a diamond grindstone. Subsequently, a mask was put thereon, and concaves (not illustrated) for thermocouples and grooves 7 (width: 0.5 mm, and depth: 0.5 mm) for adsorbing a wafer were made in the surface by blast treatment with glass beads (reference to FIG. 7(c)).

(7) Furthermore, a conductor containing paste was printed on the back surface opposite to the chuck face la in which the grooves 7 were made, so as to form a paste layer for heating elements. The used conductor containing paste was Solvest PS603D made by Tokuriki Kagaku Kenkyuzyo, which is used to form plated through holes in printed boards. Namely, this paste was a silver/lead paste, and contained metal oxides consisting of leadoxide, zinc oxide, silica, boron oxide and alumina (the weight ratio thereof was 5/55/10/25/5) at an amount of 7.5% by weight of silver.

The used silver in the conductor containing paste was scaly particles having an average particle diameter of 4.5 $\mu$m.

(8) The aluminum nitride substrate (heater plate) 3, in which the conductor containing paste was printed on its back surface to form heating elements 41, was heated and fired at a temperature of 780° C. to sinter silver and lead in the conductor containing paste and further bake them on the aluminum nitride substrate 3. Thus, the heating elements 41 were formed (reference to FIG. 7(d)). Next, this aluminum nitride substrate 3 was immersed in a bath for electroless nickel plating comprising an aqueous solution containing 30 g/L of nickel sulfate, 30 g/L of boric acid, 30 g/L of ammonium chloride, and 60 g/L of a Rochelle salt, to precipitate a nickel layer 410 having a thickness of 1 µm and a boron content of 1% or less by weight on the surface of the heating elements 41 made from the above conductor containing paste. Thus, the thickness of the heating elements 41 was made larger. Thereafter, the aluminum nitride substrate was annealed at a temperature of 120° C. for 3 hours.

The thus obtained elements 41 containing the nickel layer 410 had a thickness of 5 µm, a width of 2.4 mm and a area resistivity of 7.7 mΩ/□.

(9) By sputtering, a Ti layer, a Mo layer and a Ni layer were successively formed on the chuck face 1a in which the grooves 7 were made. The used equipment for this sputtering was SV-4540 made by ULVAC Japan, Ltd. About conditions for the sputtering, air pressure was 0.6 Pa, temperature was 100° C., electric power was 200 W, and process time was from 30 seconds to 1 minute. Sputtering time was adjusted dependently on the respective metals to be sputtered.

About the resultant films, an image from a fluorescent X-ray analyzer demonstrated that the thickness of Ti was 0.3 µm, that of Mo was 2 µm and that of Ni was 1 µm.

(10) The aluminum nitride substrate 3 obtained in the step (9) was immersed in a bath for electroless nickel plating comprising an aqueous solution containing of 30 g/L of nickel sulfate, 30 g/L of boric acid, 30 g/L of ammonium chloride, and 60 g/L of a Rochelle salt to precipitate a nickel layer (thickness: 7 µM) having a boron content of 1% or less by weight on the surface of the grooves 7 formed in the chuck face 1a. Thereafter, the aluminum nitride substrate was annealed at a temperature of 120° C. for 3 hours.

The aluminum nitride substrate 3 was immersed in an electroless gold plating solution containing 2 g/L of potassium gold cyanide, 75 g/L of ammonium chloride, 50 g/L of sodium citrate, and 10 g/L of sodium hypophosphite at a temperature of 93° C. for 1 minute, to form a gold plating layer 1 µm in thickness on the nickel plating layer at the chuck face side of the aluminum nitride substrate 3. Thus, a chuck top conductor layer 2 was formed (reference to FIG. 8(e)).

(11) Air suction holes 8 reaching the back surface from the grooves 7 were made by drilling, and then blind holes 180 for exposing plated through holes 16, 17 were made (reference to FIG. 8(f)). Brazing gold made of Ni—Au (Au: 81.5% by weight, Ni: 18.4% by weight, and impurities: 0.1% by weight) was heated and reflowed at a temperature of 970° C. to connect external terminal pins 19, 190 made of koval to the blind holes 180 (reference to FIG. 8(g)). An external terminal pin 191 made of koval was also attached through a solder alloy (tin 9/lead 1) on the heating elements 41.

(12) Thermocouples for controlling temperature were buried. (not illustrated) in the concaves, so as to obtain a heater with a wafer prober.

(13) Thereafter, the heater with the wafer prober is usually fixed to a supporting case made of stainless steel through a heat insulator comprising ceramic fiber (made by Ibiden Co., Ltd., trade name: Ibiwool). A jet nozzle for jetting cooling gas is made in the supporting case to adjust the temperature of the wafer prober.

Regarding the heater with the wafer prober, air is sucked from the air suction holes 8 to adsorb and hold a wafer put on the heater.

The thus produced heater with the wafer prober had a brightness N of 3.5 to give a large radiant heat amount. The heater was also superior in the capability of covering up the inside guard electrodes 5 and the inside ground electrodes 6.

EXAMPLE 11

Wafer Prober (Reference to FIGS. 7, 8)

(1) The following composition was used and formed by the doctor blade method to obtain a green sheet 30 having a thickness of 0.47 mm: a paste obtained by mixing 100 parts by weight of aluminum nitride powder (made by Tokuyama Corp., average particle diameter: 1.1 µm), 4 parts by weight of yttria (average particle diameter: 0.4 µm), 0.09 part by weight of amorphous carbon obtained in Example 1, and 53% by weight of alcohols comprising 1-butanol and ethanol.

(2) Next, this green sheet 30 was used to produce a heater with a wafer prober in the same way as in the steps (2) to (12) of Example 10. Furthermore, the heater with the wafer prober was fixed onto a supporting case made of stainless steel in the same way as in the step (13) of Example 10.

The thus produced heater with the wafer prober exhibited a brightness N of 3.5 to give a large radiant heat amount. The heater was also superior in the capability of covering up the inside guard electrodes 5 and the inside ground electrodes 6.

EXAMPLE 12

Ceramic Heater Having Therein Heating Elements and Electrostatic Electrodes for an Electrostatic Chuck (Reference to FIG. 4)

(1) The following paste was used and formed by the doctor blade method to obtain a green sheet 0.47 mm in thickness: a paste obtained by mixing 100 parts by weight of aluminum nitride powder (made by Tokuyama Corp., average particle diameter: 1.1 µm), 4 parts by weight of yttria (average particle diameter: 0.4 µm), 0.09 part by weight of amorphous carbon obtained in Example 1, 0.5 part by weight of a dispersant, and 53 parts by weight of alcohols comprising 1-butanol and ethanol.

(2) Next, this green sheet was dried at a temperature of 80° C. for 5 hours, and subsequently the following holes were made by punching: holes which would be through holes of 1.8 mm, 3.0 mm and 5.0 mm in diameter through which semiconductor wafer supporting pins would be inserted; and holes which would be plated through holes for the connection to external terminals pins.

(3) The following were mixed to prepare a conductor containing paste A: 100 parts by weight of tungsten carbide particles having an average particle diameter of 1 µm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste A was printed on the green sheet by screen printing, to form a conductor containing paste layer. The pattern of the printing was made into a concentric pattern. Furthermore, conductor containing paste layers having an electrostatic electrode pattern shown in FIG. 4 was formed on other green sheet.

Moreover, the conductor containing paste B was filled into the through holes for the plated through holes for the connection to external terminal.

At a temperature of 130° C. and a pressure of 80 kg/cm², thirty seven green sheets on which no tungsten paste was printed were stacked on the upper side (heating surface) of the green sheet that had been subjected to the above-mentioned processing, and simultaneously the same thirteen green sheets were stacked on the lower side of the green sheet.

(4) Next, the resultant lamination was degreased at a temperature of 600° C. in the atmosphere of nitrogen gas for 5 hours and hot-pressed at a temperature of 1890° C. and at a pressure of 150 kg/cm² for 3 hours to obtain an aluminum nitride plate 3 mm in thickness. This was cut off into a disk of 230 mm in diameter to prepare a ceramic plate having therein heating elements and, electrostatic electrodes having a thickness of 6 μm and a width of 10 mm. The amount of carbon in this sintered body was measured by the same measurement method as in Example 1. As a result, the amount was 810 ppm.

(5) Next, the plate obtained in the step (4) was ground with a diamond grindstone. Subsequently a mask was put thereon, and bottomed holes (diameter: 1.2 mm, and depth: 2.0 mm) for thermocouples were made in the surface by blast treatment with SiC and the like.

(6) Furthermore, a part of the through holes for the plated through holes was hollowed out to make concaves. Brazing gold made of Ni—Au was heated and reflowed at a temperature of 700° C. to connect external terminal made of koval to the concaves.

About the connection of the external terminal, a structure wherein a support of tungsten is supported at three points is desirable. This is because the reliability of the connection can be kept.

(7) Next, thermocouples for controlling temperature were buried in the bottomed holes to finish the production of a ceramic heater with an electrostatic chuck.

The thus produced heater with the electrostatic chuck had a brightness N of 3.5 to give a large radiant heat amount. The heater was also superior in the capability of covering up the inside guard electrodes and the inside ground electrodes.

EXAMPLE 13

Ceramic Heater (AlN+Y₂O₃+Amorphous Carbon+ Graphite)

An aluminum nitride sintered body was obtained in the same way as in Example 4, and subsequently resistance heating elements 92 were disposed on the bottom surface of the sintered body in the same way as in the steps (2) to (6) in Example 7, so as to obtain a ceramic heater 10 (reference to FIG. 15).

EXAMPLE 14

Ceramic Heater (AlN+Amorphous Carbon+Graphite)

An aluminum nitride sintered body was obtained in the same way as in Example 5, and subsequently resistance heating elements 92 were disposed on the bottom surface of the sintered body in the same way as in the steps (2) to (6) in Example 7, so as to obtain a ceramic heater 10 (reference to FIG. 15).

EXAMPLE 15

Ceramic Heater (Forming Solid Solution of Carbon)

An aluminum nitride sintered body was obtained in the same way as in Example 6, and subsequently resistance heating elements 92 were disposed on the bottom surface of the sintered body in the same way as in the steps (2) to (6) in Example 7, so as to obtain a ceramic heater 10 (reference to FIG. 15).

The ceramic heaters obtained in Examples 13 to 15 exhibited a brightness N of 4.0 or less to give a large radiant heat amount. The ceramic heaters also had a sufficiently large volume resistivity in a high temperature range. Therefore, neither leakage current nor short circuit was generated.

The dependency of the thermal conductivities of the ceramic heater of Example 7 which comprised only amorphous carbon, and the ceramic heater of Example 13 which comprised both of amorphous carbon and crystalline carbon, upon temperature was measured. As a result, in the ceramic heater of Example 7 its thermal conductivity dropped in a high temperature range. On the other hand, in the ceramic heater of Example 13 a high thermal conductivity was kept even in a high temperature range.

Electric current was applied to the ceramic substrates (ceramic heaters) for semiconductor devices of Examples 13 to 15 so that the ceramic substrates were heated up to 500° C. Their surface temperatures were measured with a thermoviewer (made by Japan Datum Inc., IR162012-0012) and a K type thermocouple according to JIS C 1602 (1980) to examine temperature difference between the two measured values. Results of the measurement are as follows: a temperature difference was 0.8° C. in Example 1; a temperature difference was 0.9° C. in Example 2; and a temperature difference was 1.0° C. in Example 3.

EXAMPLE 16

Wafer Prober (Reference to FIGS. 7, 8)

(1) The following composition was used and formed by the doctor blade method to obtain a green sheet 30 having a thickness of 0.47 mm: a paste obtained by mixing 100 parts by weight of aluminum nitride powder (made by Tokuyama Corp., average particle diameter: 1.1 μm), 4 parts by weight of yttria (average particle diameter: 0.4 μm), 0.2 part by weight of sucrose, 0.05 part by weight of graphite, and 53 parts by weight of alcohols comprising 1-butanol and ethanol.

(2) Next, this green sheet 30 was used to produce a heater with a wafer prober in the same way as in the steps (2) to (12) of Example 10. Furthermore, the heater with the wafer prober was fixed onto a supporting case made of stainless steel in the same way as in the step (13) of Example 10.

The thus produced heater with the wafer prober exhibited a brightness N of 3.5 to give a large radiant heat amount. The heater was also superior in the capability of covering up the inside guard electrodes 5 and the inside ground electrodes 6 therein.

EXAMPLE 17

Wafer Prober (Reference to FIGS. 7, 8)

(1) The following composition was used and formed by the doctor blade method to obtain a green sheet 30 having a thickness of 0.47 mm: a paste obtained by mixing 100 parts by weight of aluminum nitride powder (made by Tokuyama Corp., average particle diameter: 1.1 μm), 4 parts by weight of yttria (average particle diameter: 0.4 μm), 0.05 part by weight of amorphous carbon obtained in Example 4, 0.05 part by weight of graphite powder, and 53 parts by weight of alcohols comprising 1-butanol and ethanol.

(2) Next, this green sheet 30 was used to produce a heater with a wafer prober in the same way as in the steps (2) to (12) of Example 10. Furthermore, the heater with the wafer prober was fixed onto a supporting case made of stainless steel in the same way as in the step (13) of Example 10.

The thus produced heater with the wafer prober exhibited a brightness N of 3.5 to give a large radiant heat amount. The heater was also superior in the capability of covering up the inside guard electrodes 5 and the inside ground electrodes 6.

EXAMPLE 18

Ceramic Heater Having Therein Heating Elements and Electrostatic Electrodes for an Electrostatic Chuck (Reference to FIG. 4)

(1) The following paste was used and formed by the doctor blade method to obtain a green sheet of 0.47 mm in thickness: a paste obtained by mixing 100 parts by weight of aluminum nitride powder (made by Tokuyama Corp., average particle diameter: 1.1 μm), 4 parts by weight of yttria (average particle diameter: 0.4 μm), 0.04 part by weight of amorphous carbon obtained in Example 4, 0.05 part by weight of crystalline graphite powder, 0.5 part by weight of a dispersant, 0.2 part by weight of sucrose, 0.05 part by weight of graphite and 53 parts by weight of alcohols comprising 1-butanol and ethanol.

(2) Next, this green sheet 30 was used to produce a heater with an electrostatic chuck in the same way as in the steps (2) to (7) of Example 12.

The amount of carbon in the aluminum nitride sintered body obtained in this Example was measured by the same measurement method as in Example 1. As a result, the amount was 810 ppm.

The thus produced heater with the electrostatic chuck exhibited a brightness N of 3.5 to give a large radiant heat amount. The heater was also superior in the capability of covering up the inside resistance heating elements and the inside electrostatic electrodes.

EXAMPLE 19

Ceramic Heater Having Therein Heating Elements and Electrostatic Electrodes for an Electrostatic Chuck (Reference to FIG. 4)

(1) The following paste was used and formed by the doctor blade method to obtain a green sheet 0.47 mm in thickness: a paste obtained by mixing 100 parts by weight of aluminum nitride powder (made by Tokuyama Corp., average particle diameter: 1.1 μm), 4 parts by weight of yttria (average particle diameter: 0.4 μm), 0.05 part by weight of amorphous carbon obtained in Example 1, 0.05 part by weight of crystalline graphite powder, 0.5 part by weight of a dispersant, and 53 parts by weight of alcohols comprising 1-butanol and ethanol.

(2) Next, this green sheet 30 was used to produce a ceramic heater with an electrostatic chuck in the same way as in the steps (2) to (7) of Example 12.

The amount of carbon in the aluminum nitride sintered body obtained in this Example was measured by the same measurement method as in Example 1. As a result, the amount was 850 ppm.

The thus produced heater with the electrostatic chuck exhibited a brightness N of 3.5 to give a large radiant heat amount. The heater was also superior in the capability of covering up the inside resistance heating elements and electrostatic electrodes.

EXAMPLES 20 TO 21

In the present Examples, ceramic heaters were obtained in the same way as in Example 13 except that the ratio between amorphous carbon and crystalline carbon was changed as shown in the following Table 1. The volume resistivity (Ω·cm) and the thermal conductivity (W/m·K) thereof at a temperature of 400° C. were measured and the amount of carbon was measured.

TABLE 1

| | Carbon ratio (weight ratio) crystalline carbon/amorphous carbon | Volume resistivity (Ω · cm) | Thermal conductivity (W/m · K) | Carbon content (ppm) |
|---|---|---|---|---|
| Example 20 | 0.01/0.10 | $1 \times 10^9$ | 110 | 900 |
| Example 21 | 0.10/0.01 | $1 \times 10^{10}$ | 90 | 900 |

As is evident from Table 1, the present ceramic heaters have sufficiently good values in their volume resistivity and thermal conductivity.

INDUSTRIAL APPLICABILITY

As described above, the aluminum nitride sintered body of the first aspect of the present invention comprises amorphous carbon so that: the aluminum nitride sintered body has a high volume resistivity at high temperature and a low brightness; an accurate temperature measurement of the aluminum nitride sintered body with a thermoviewer is possible; and the aluminum nitride sintered body is useful as a substrate for a hot plate, an electrostatic chuck, a wafer prober, and the like.

The aluminum nitride sintered body of the second aspect of the present invention comprises 2 kinds of carbon which are complementary to each other so that: an aluminum nitride sintered body is superior in the capability of covering up an electrode pattern and precision of temperature measurement with a thermoviewer; it is also superior in volume resistivity at high temperature and thermal conductivity and has a low brightness; and it is useful as a substrate for a hot plate, an electrostatic chuck, a wafer prober, and the like.

The ceramic substrate for a semiconductor-producing/examining device of the third aspect of the present invention comprises amorphous carbon so that: the ceramic substrate has a high volume resistivity at high temperature and a low brightness; it makes an accurate temperature measurement with a thermoviewer possible; and it is useful as a substrate for a hot plate, an electrostatic chuck, a wafer prober, and the like.

The ceramic substrate for a semiconductor-producing/examining device of the fourth aspect of the present invention comprises 2 kinds of carbon which are complementary to each other so that: the ceramic substrate is superior in the capability of covering up an electrode pattern and precision of temperature measurement with a thermoviewer; it is also superior in volume resistivity at high temperature and thermal conductivity, and has a low brightness; and it is useful as a substrate for a hot plate, an electrostatic chuck, a wafer prober, and the like.

The invention claimed is:

1. A carbon-containing aluminum nitride sintered body comprising: carbon whose peak cannot be detected on its X-ray diffraction chart or whose peak is below its detection limit thereon; in a matrix made of aluminum nitride,
   wherein
   said carbon is carbon forming solid solution in the phase of aluminum nitride crystal,
   the content of said carbon is from 200 to 5000 ppm, and
   said matrix contains 0.1% to 10% by weight of a sintered aid comprising at least one of an alkali metal oxide, and alkali earth metal oxide, and a rare earth oxide.

2. The carbon-containing aluminum nitride sintered body according to claim 1,
   wherein its brightness defined in JIS Z 8721 is N4 or less.

* * * * *